(12) United States Patent
Tsai et al.

(10) Patent No.: US 11,430,698 B2
(45) Date of Patent: Aug. 30, 2022

(54) IN-SITU FORMATION OF METAL GATE MODULATORS

(71) Applicant: Taiwan Semiconductor Manufacturing Co., Ltd., Hsinchu (TW)

(72) Inventors: Hsin-Han Tsai, Hsinchu (TW); Chung-Chiang Wu, Taichung (TW); Cheng-Lung Hung, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/877,708

(22) Filed: May 19, 2020

(65) Prior Publication Data

US 2021/0366775 A1  Nov. 25, 2021

(51) Int. Cl.
*H01L 21/8234* (2006.01)
*H01L 21/28* (2006.01)
*H01L 27/088* (2006.01)
*H01L 29/49* (2006.01)

(52) U.S. Cl.
CPC .. *H01L 21/82345* (2013.01); *H01L 21/28088* (2013.01); *H01L 21/823431* (2013.01); *H01L 27/0886* (2013.01); *H01L 29/4966* (2013.01)

(58) Field of Classification Search
CPC ....... H01L 21/82345; H01L 21/280088; H01L 21/823431; H01L 27/0886; H01L 29/4966
See application file for complete search history.

(56) References Cited

U.S. PATENT DOCUMENTS

| 6,861,350 | B1* | 3/2005 | Ngo ................. H01L 21/28088 |
| | | | 257/E21.204 |
| 10,211,309 | B2 | 2/2019 | Zhou |
| 10,297,453 | B2 | 5/2019 | Tsai et al. |
| 10,804,158 | B2 | 10/2020 | Cho et al. |
| 10,998,415 | B2 | 5/2021 | JangJian et al. |
| 11,024,505 | B2 | 6/2021 | Wei et al. |
| 11,296,201 | B2 | 4/2022 | Hsieh et al. |
| 2012/0025327 | A1* | 2/2012 | Ji ........................ H01L 21/283 |
| | | | 257/411 |
| 2013/0049091 | A1 | 2/2013 | Saino |

(Continued)

FOREIGN PATENT DOCUMENTS

| CN | 106601605 A | 4/2017 |
| CN | 110364415 A | 10/2019 |

(Continued)

*Primary Examiner* — Christine A Enad
(74) *Attorney, Agent, or Firm* — Slater Matsil, LLP

(57) ABSTRACT

A method includes forming a gate dielectric on a semiconductor region, depositing a work-function layer over the gate dielectric, depositing a silicon layer over the work-function layer, and depositing a glue layer over the silicon layer. The work-function layer, the silicon layer, and the glue layer are in-situ deposited. The method further includes depositing a filling-metal over the glue layer; and performing a planarization process, wherein remaining portions of the glue layer, the silicon layer, and the work-function layer form portions of a gate electrode.

20 Claims, 25 Drawing Sheets

(56) References Cited

U.S. PATENT DOCUMENTS

| | | | |
|---|---|---|---|
| 2013/0069166 A1* | 3/2013 | Ji | H01L 29/512 257/369 |
| 2016/0035631 A1* | 2/2016 | Lee | H01L 29/4966 438/16 |
| 2016/0093535 A1* | 3/2016 | Xu | H01L 21/02244 257/392 |
| 2017/0110551 A1* | 4/2017 | Lee | H01L 29/4966 |
| 2017/0110553 A1* | 4/2017 | Zhou | H01L 21/823821 |
| 2018/0138178 A1 | 5/2018 | Lin et al. | |
| 2018/0261677 A1 | 9/2018 | Lee et al. | |
| 2019/0081148 A1* | 3/2019 | Chung | H01L 29/0673 |
| 2019/0311953 A1* | 10/2019 | Cho | H01L 29/401 |
| 2020/0105594 A1 | 4/2020 | Cheng et al. | |
| 2020/0105895 A1 | 4/2020 | Tang et al. | |
| 2020/0135915 A1 | 4/2020 | Savant et al. | |

FOREIGN PATENT DOCUMENTS

| | | |
|---|---|---|
| KR | 20160129664 A | 11/2016 |
| KR | 20170015055 A | 2/2017 |
| KR | 20170063398 A | 6/2017 |
| KR | 20180102273 A | 9/2018 |
| KR | 20190037057 A | 4/2019 |
| KR | 20200037106 A | 4/2020 |
| TW | 201128713 A | 8/2011 |

* cited by examiner

IN-SITU FORMATION OF METAL GATE MODULATORS

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be generated at the surface of the semiconductor.

Metal gates may include a plurality of layers, so that the different requirements of NMOS devices and PMOS devices can be met. The formation of metal gates typically involves removing dummy gate stacks to form trenches, depositing a plurality of metal layers extending into the trenches, forming metal regions to fill the remaining portions of the trenches, and then performing a Chemical Mechanical Polish (CMP) process to remove excess portions of the metal layers. The remaining portions of the metal layers and metal regions form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
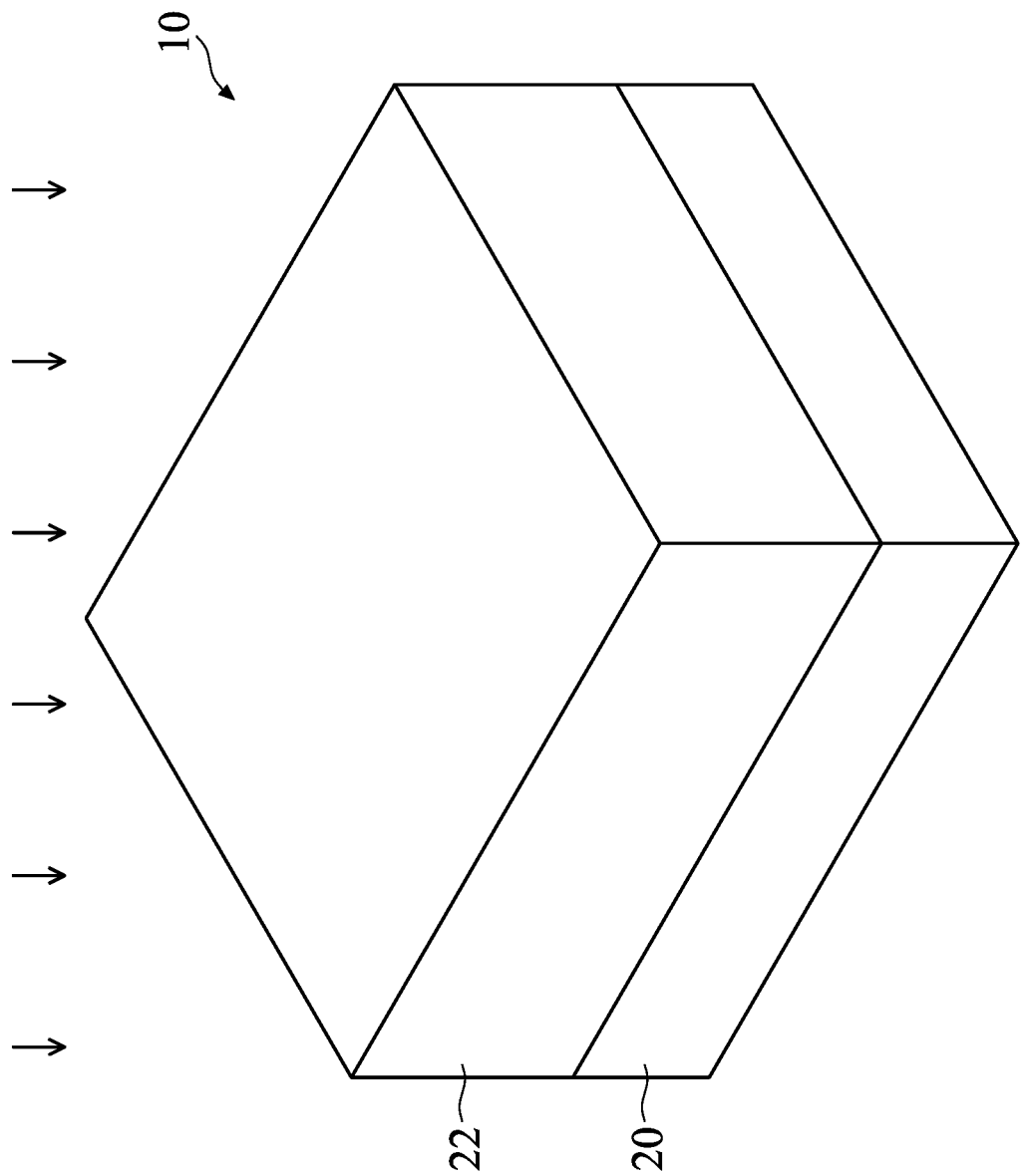
FIGS. 1-6, 7A, 7B, 8A, 8B, 9-18, 19A, and 19B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The methods of forming metal gates for transistors with improved reliability are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors, Gate-All-Around (GAA) transistors, and the like may also be formed adopting the concept of the present disclosure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

In accordance with some embodiments of the present disclosure, a metal gate with a work-function layer is formed for a transistor. A capping layer and a silicon layer are added on top of the work-function layer to reduce the oxidation of the work-function layer. Since the silicon layer may be oxidized when exposed to air, the work-function layer, the capping layer, the silicon layer, and a glue layer over the silicon layer are in-situ formed, with no vacuum break between the formation processes, so that the oxidation of the silicon layer is at least reduced, or eliminated. As a result, the gate contact resistance is reduced. Furthermore, the reliability of a gate dielectric underlying the work-function layer is improved.

Figure 22:
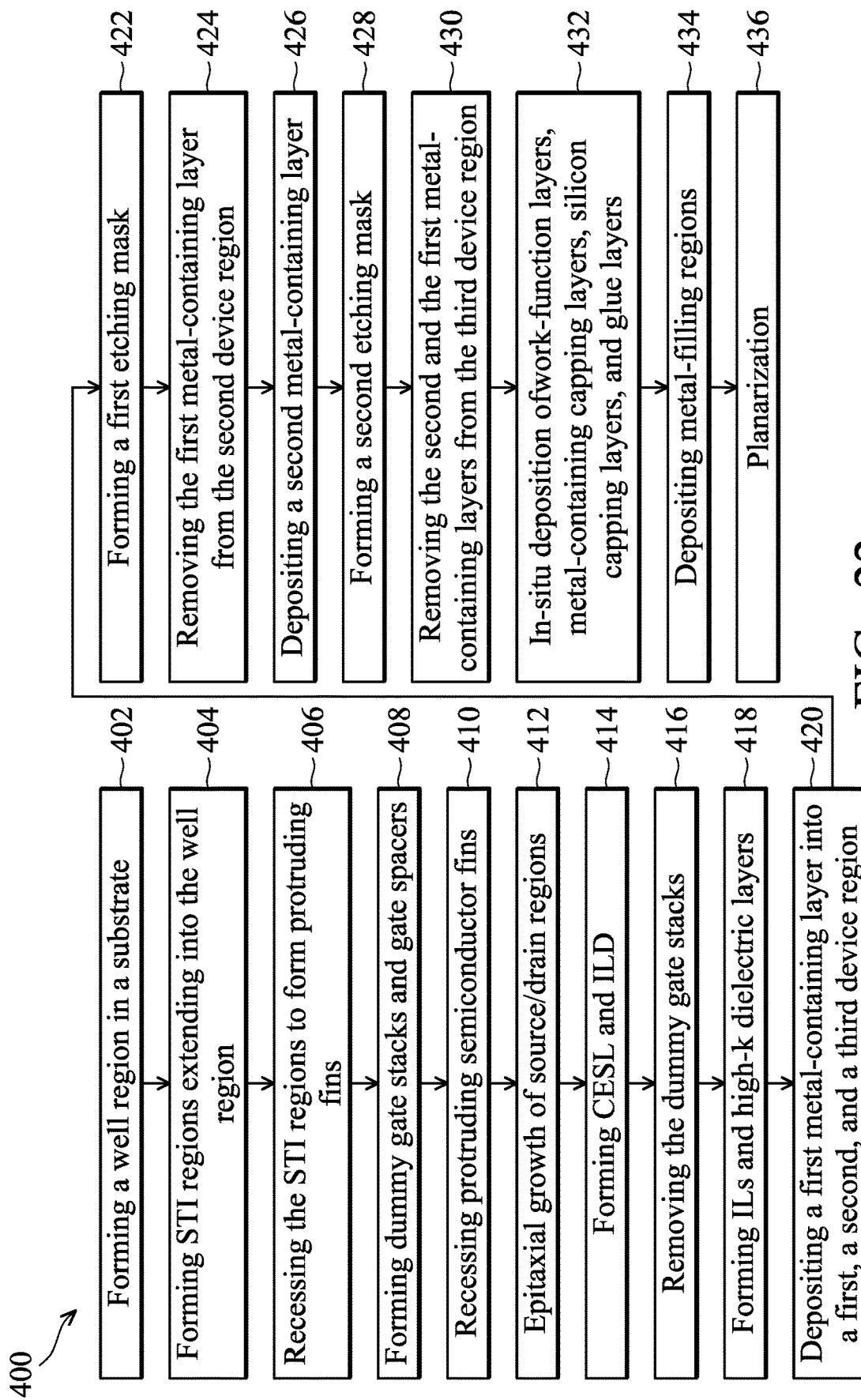
FIG. 22 illustrates a process flow for forming FinFETs in accordance with some embodiments.

FIGS. 1-6, 7A, 7B, 8A, 8B, 9-18, 19A, and 19B illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 shown in FIG. 22.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 shown in FIG. 22. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
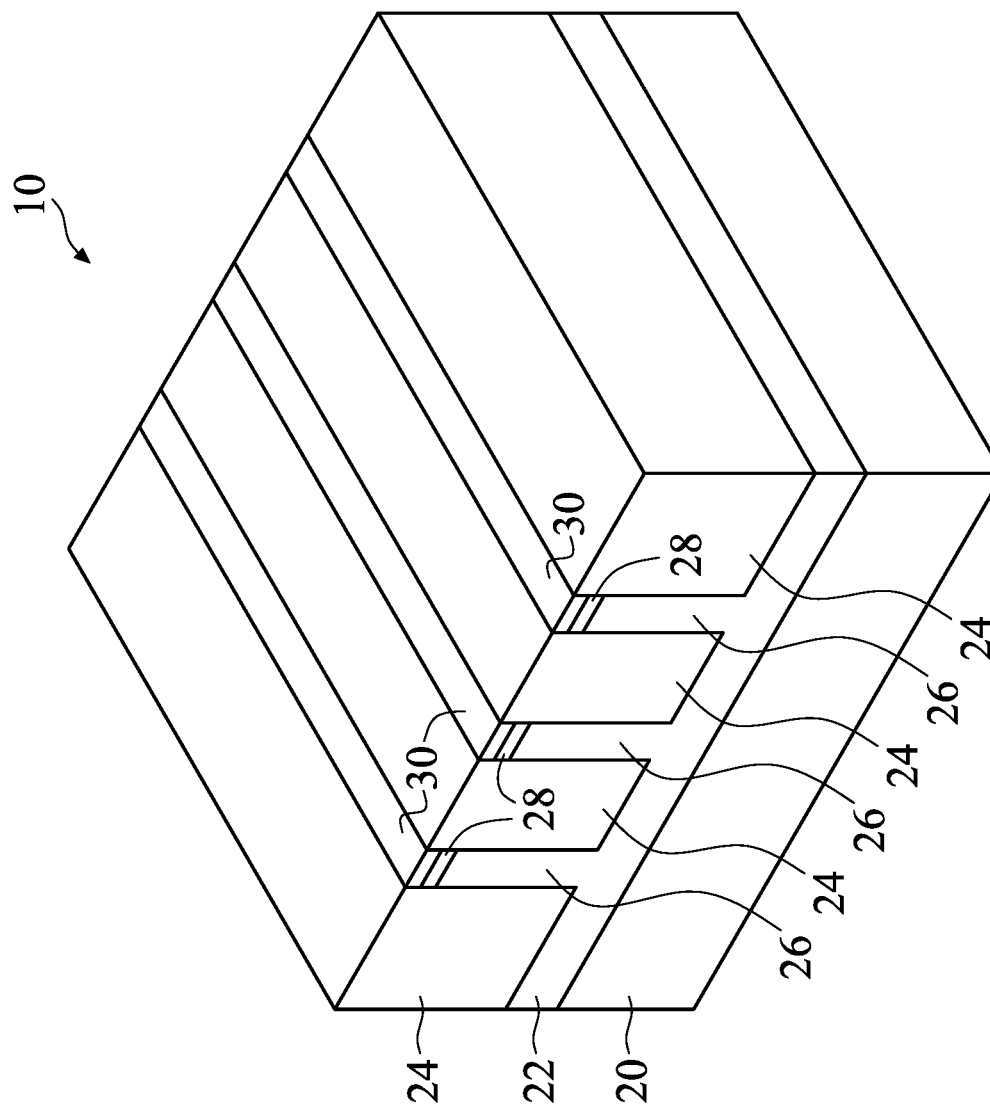

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 22. The portions of substrate 20 between neighboring STI regions 24 are referred to as semiconductor strips 26. To form STI regions 24, pad oxide layer 28 and hard mask layer 30 may be formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed using Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through the thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), Chemical Vapor Deposition (CVD), or the like. STI regions 24 also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard mask layers 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
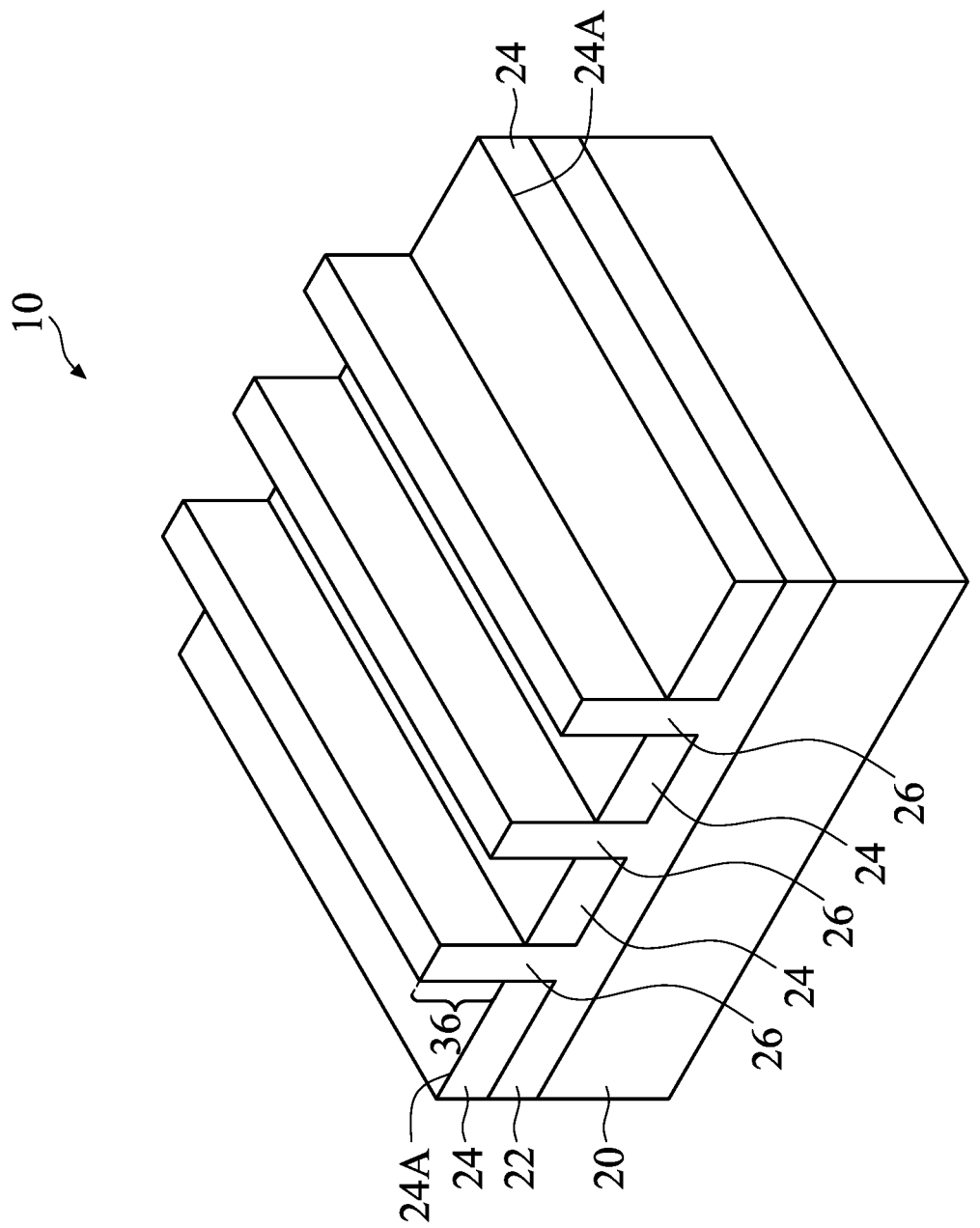

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 22. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
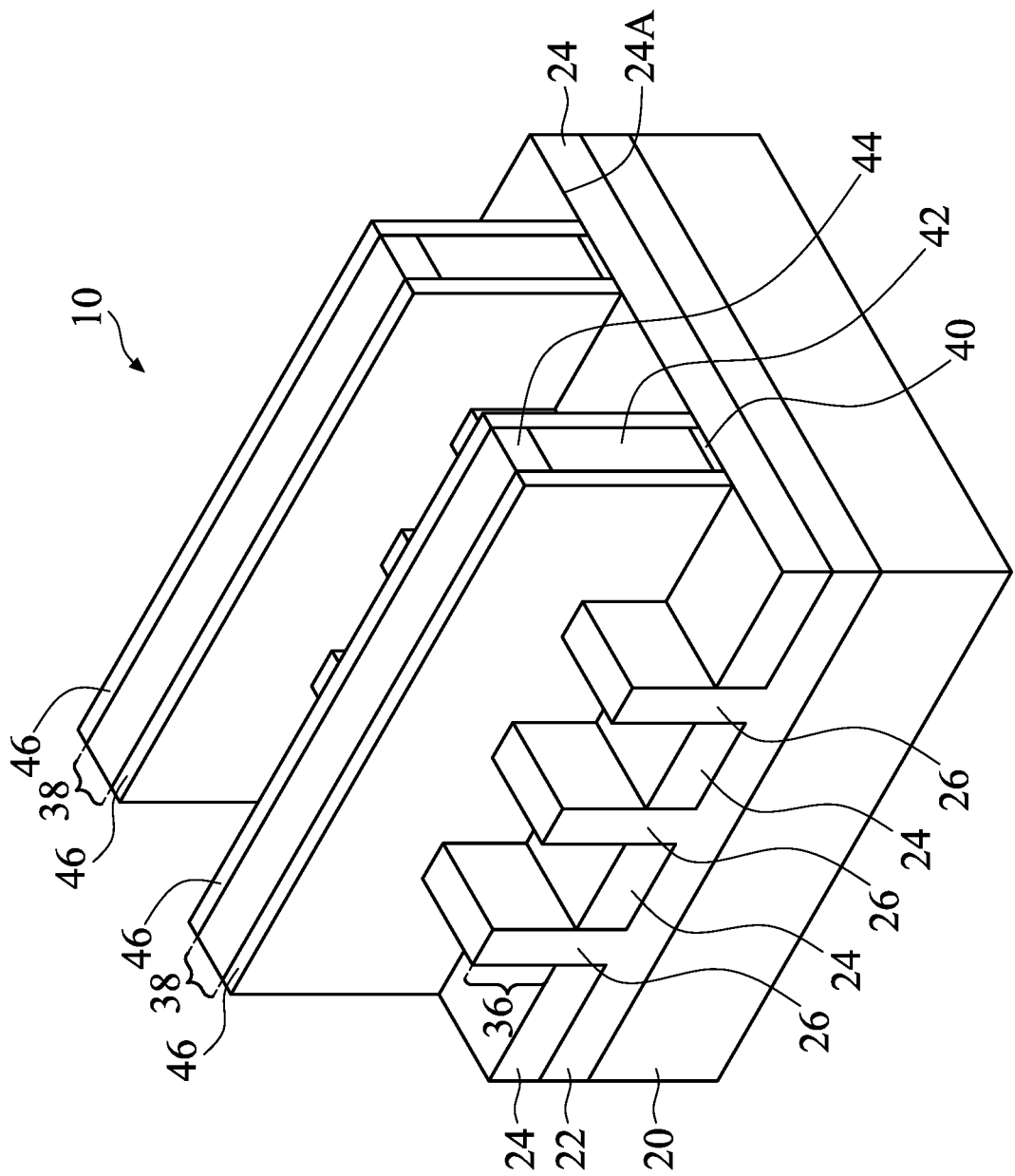

Referring to FIG. 4, dummy gate stacks 38 are formed to extend on the top surfaces and the sidewalls of (protruding) fins 36. The respective process is illustrated as process 408 in the process flow 400 shown in FIG. 22. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 22. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
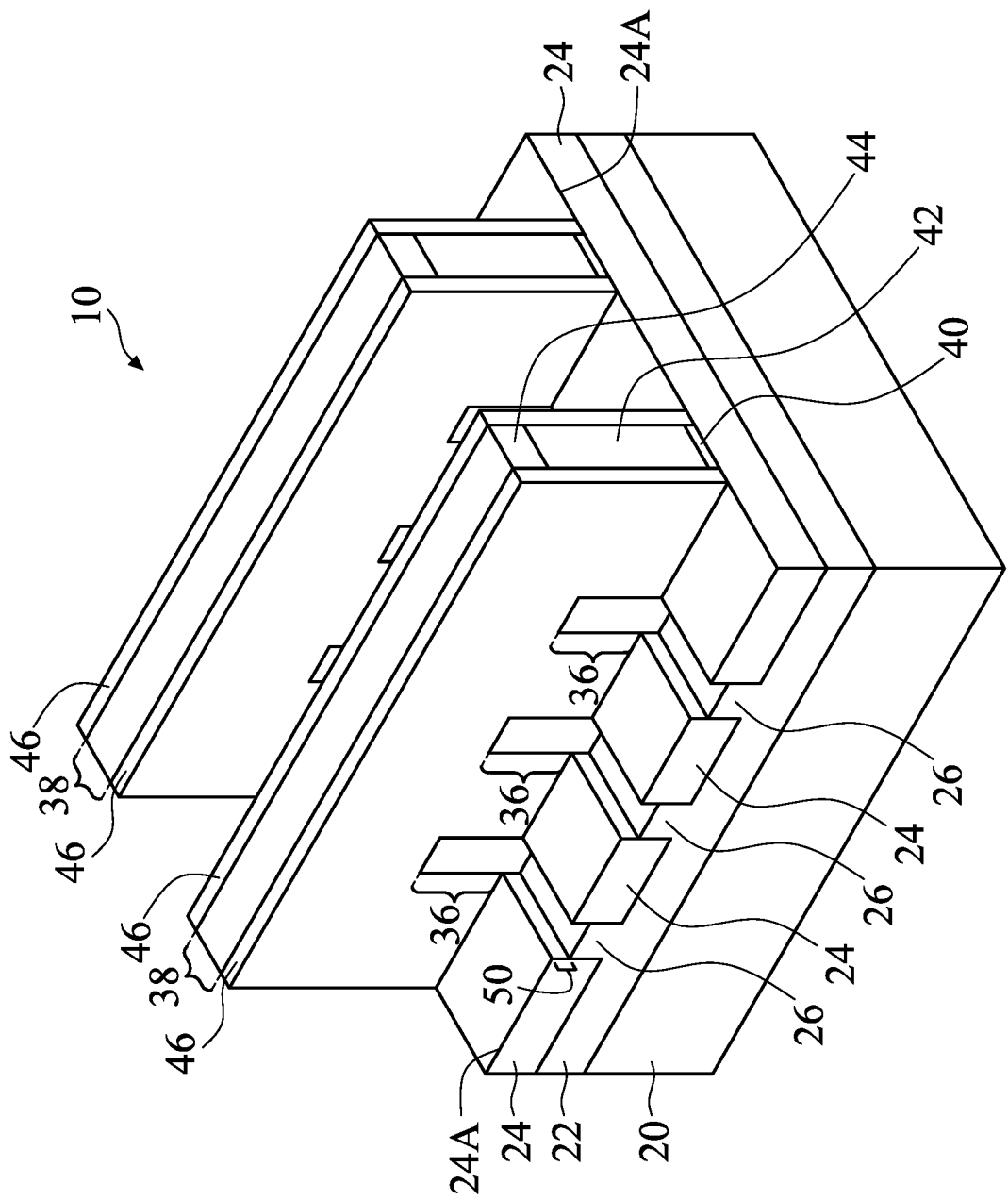

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 22. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between the remaining portions of protruding fins 36.

Figure 6:
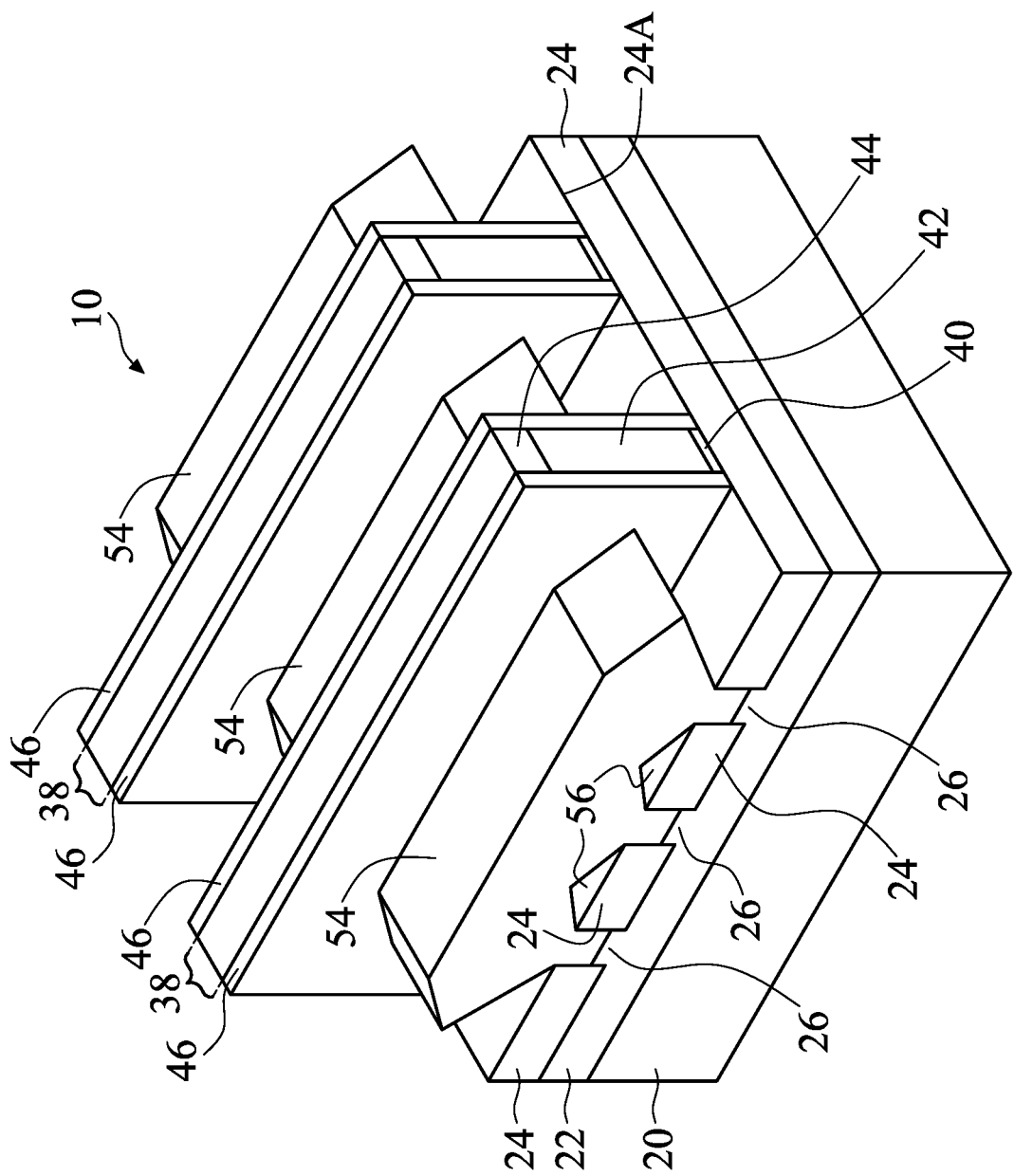

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 22. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
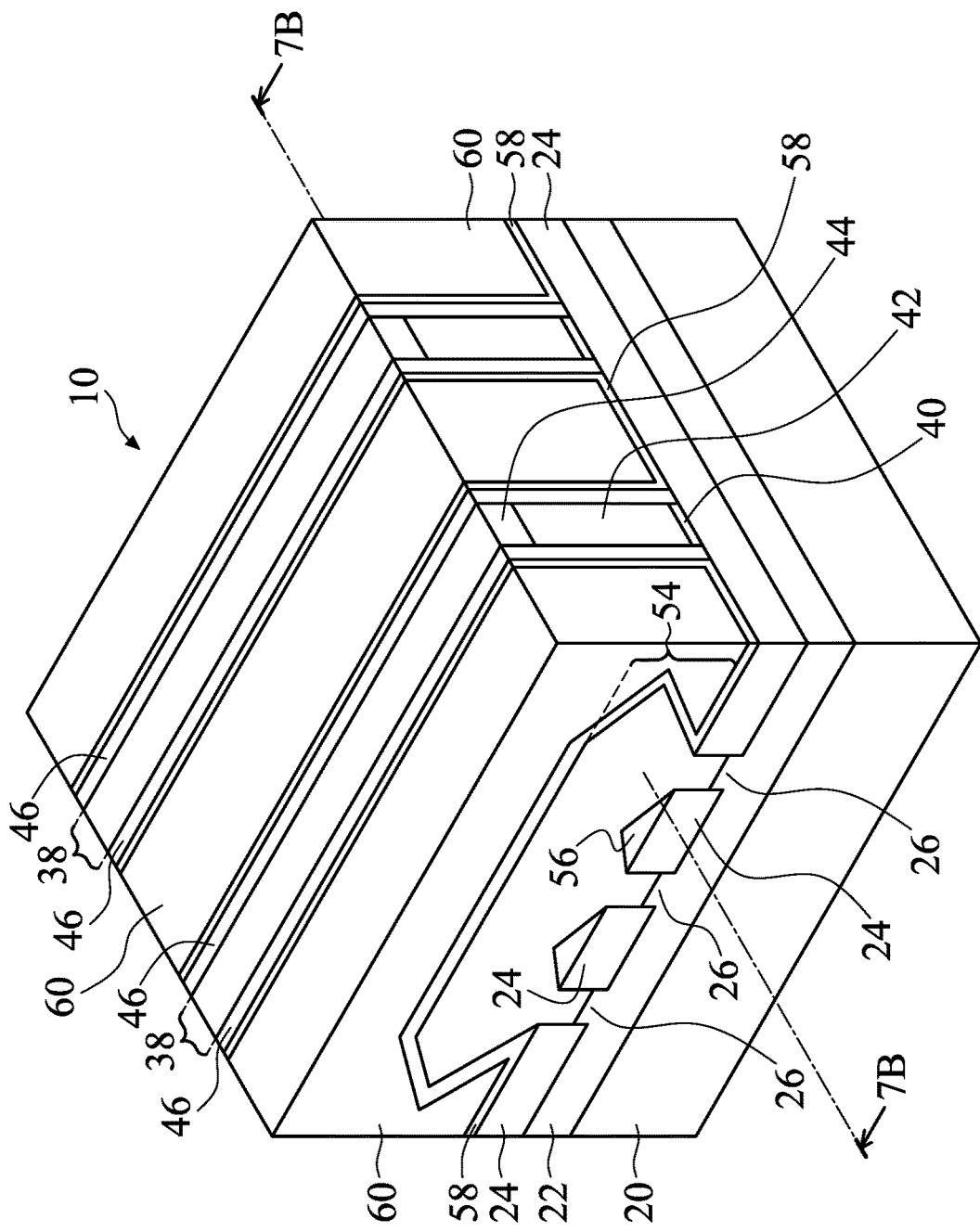

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 22. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
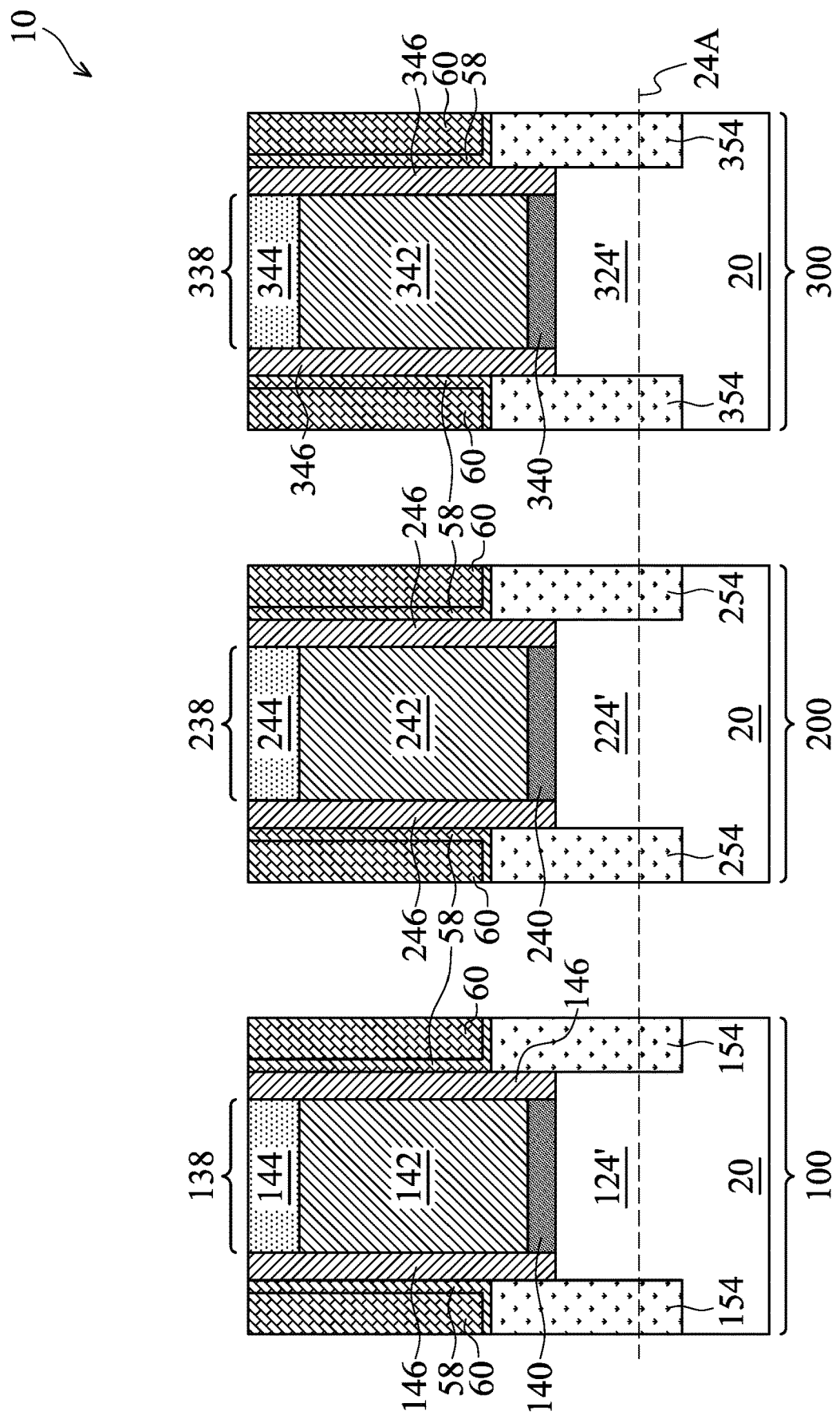

FIG. 7B illustrates the cross-sectional views of an intermediate structure in the formation of a first FinFET, a second FinFET, and a third FinFET (198, 298 and 398 in FIG. 19A) on the same substrate 20. It is appreciated that FinFETs are examples, and other types of transistors such as nano-sheet transistors, nano-wire transistors, planar transistors, gate-all-around transistors, or the like, may also be formed by applying the concept of the present disclosure. In accordance with some embodiments, the first FinFET, the second FinFET, and the third FinFET are formed in device regions 100, 200, and 300, respectively. In accordance with some embodiments, the three FinFETs as shown in the illustrated example embodiments are n-type FinFETs. In accordance with alternative embodiments, the three FinFETs are p-type FinFETs. In accordance with yet other embodiments, the three FinFETs include the mixture of n-type FinFET(s) and p-type FinFET(s) in any combination. The cross-sectional view of either one of the first FinFET, the second FinFET, and the third FinFET may correspond to the cross-sectional view obtained from the vertical plane containing line 7B-7B in FIG. 7A.

To distinguish the features in the first FinFET, the second FinFET, and the third FinFET, the features in device region 100 may be represented using the reference numerals of the corresponding features in FIG. 7A plus number 100, and the features in the device region 200 in FIG. 7B may be represented using the reference numerals of the corresponding features in FIG. 7A plus number 200. Similarly, the features in the third FinFET in device region 300 may be represented using the reference numerals of the corresponding features in FIG. 7A plus number 300. For example, the source/drain regions 154, 254, and 354 in FIG. 7B correspond to source/drain regions 54 in FIG. 7A, and the gate spacers 146, 246, and 346 in FIG. 7B correspond to the gate spacers 46 in FIG. 7A. The corresponding features in device regions 100, 200, and 300 may be formed in common processes, with some of the example processes discussed in subsequent paragraphs, or may be formed in separate processes.

After the structure shown in FIGS. 7A and 7B is formed, dummy gate stacks 138, 238, and 338 in FIG. 7B are replaced with metal gates and replacement gate dielectrics, as shown in FIGS. 8A, 8B, and 9-18. In these figures, the top surfaces 24A of STI regions 24 are illustrated, and semiconductor fins 124', 224' and 324' protrude higher than top surfaces 24A of the respective adjacent STI regions 24.

Figure 8A:
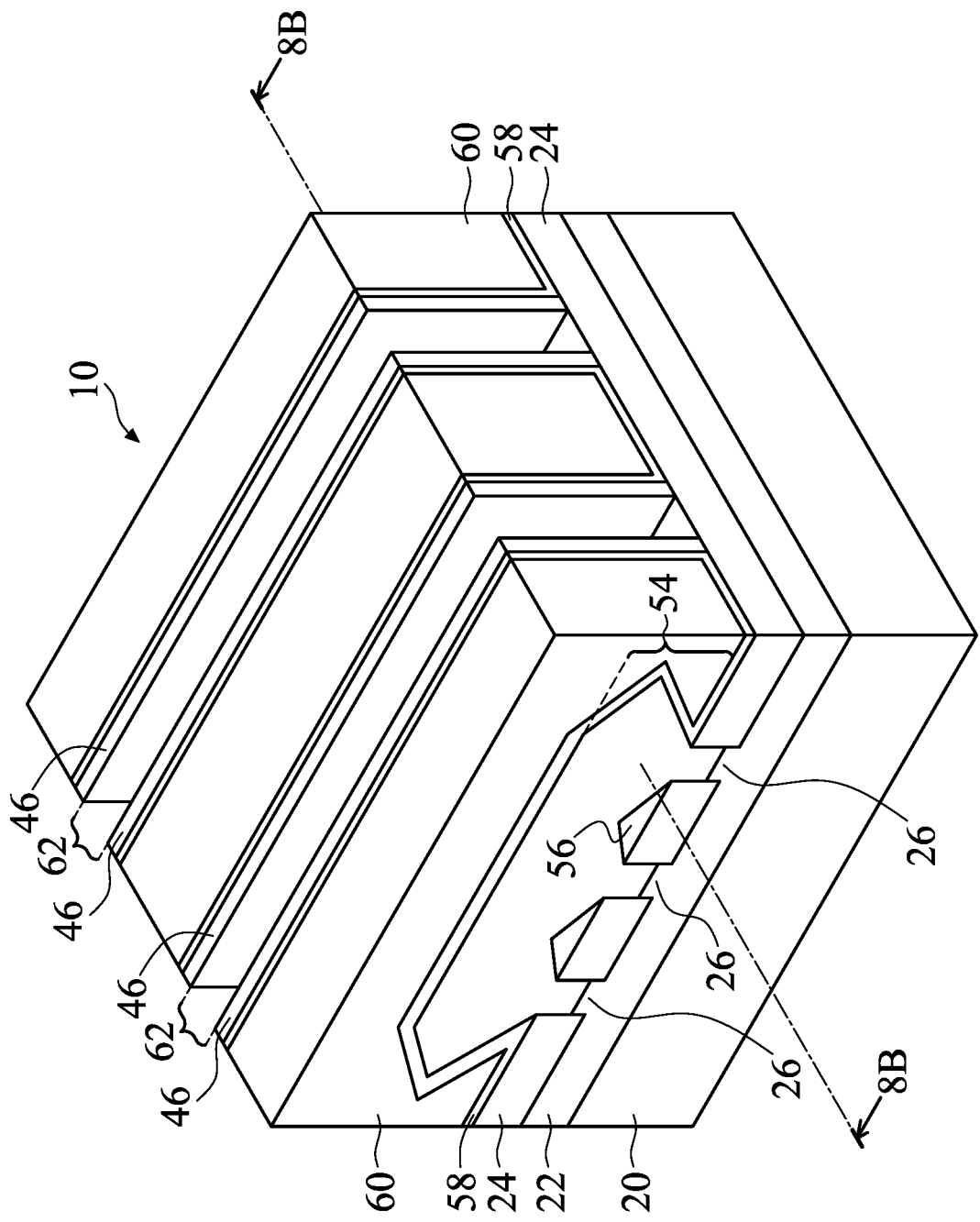
Figure 8B:
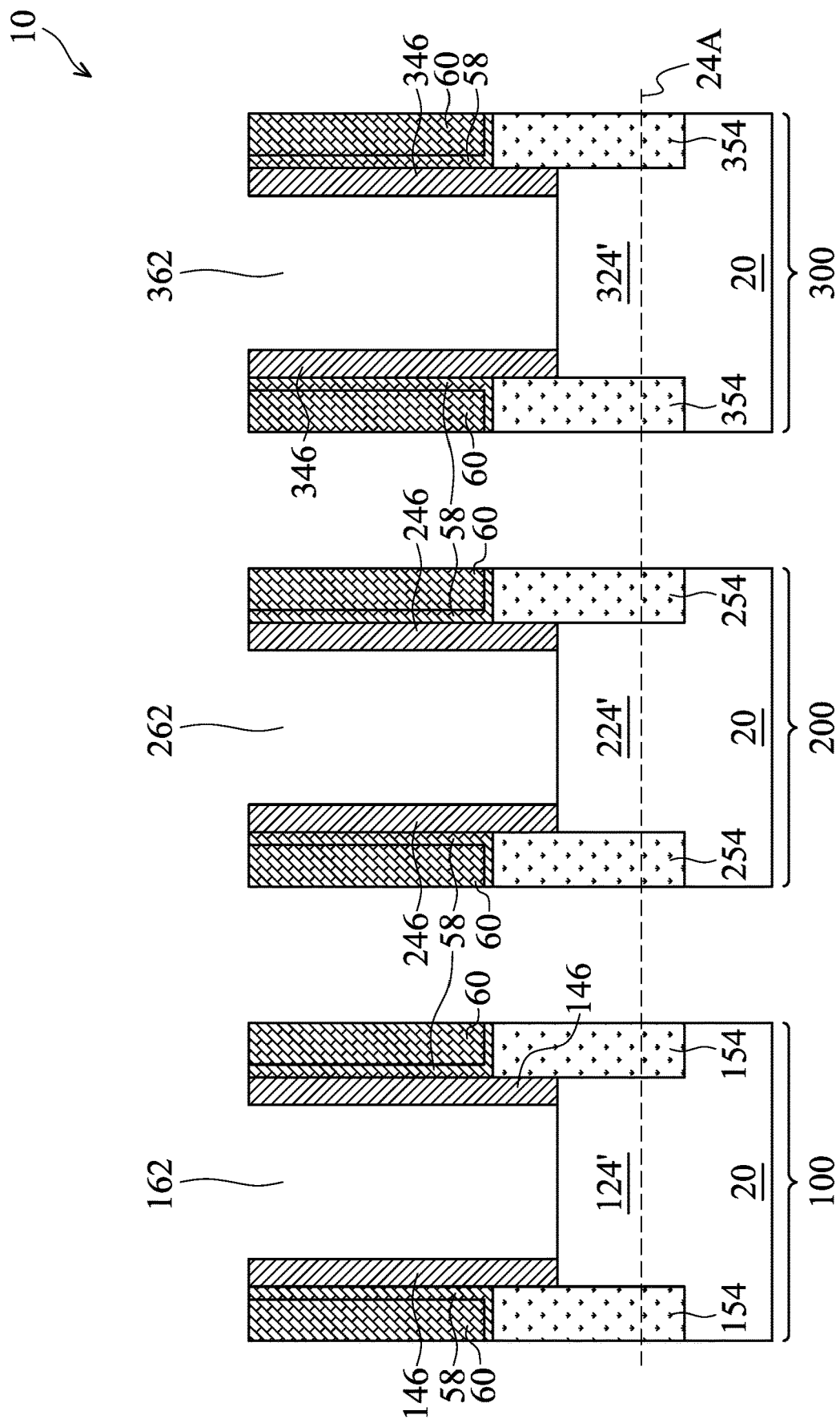

To form the replacement gates, hard mask layers 144, 244, and 344, dummy gate electrodes 142, 242, and 342, and dummy gate dielectrics 140, 240, and 340 as shown in FIGS. 7A and 7B are removed first, forming trenches 62 as shown in FIG. 8A. The respective process is illustrated as process 416 in the process flow 400 shown in FIG. 22. Trenches 62 in FIG. 8A correspond to trench 162 in device region 100, trench 262 in device region 200, and trench 362 in device region 300 as shown in FIG. 8B. The top surfaces and the sidewalls of protruding fins 124', 224' and 324' are exposed to trenches 162, 262, and 362, respectively.

Figure 9:
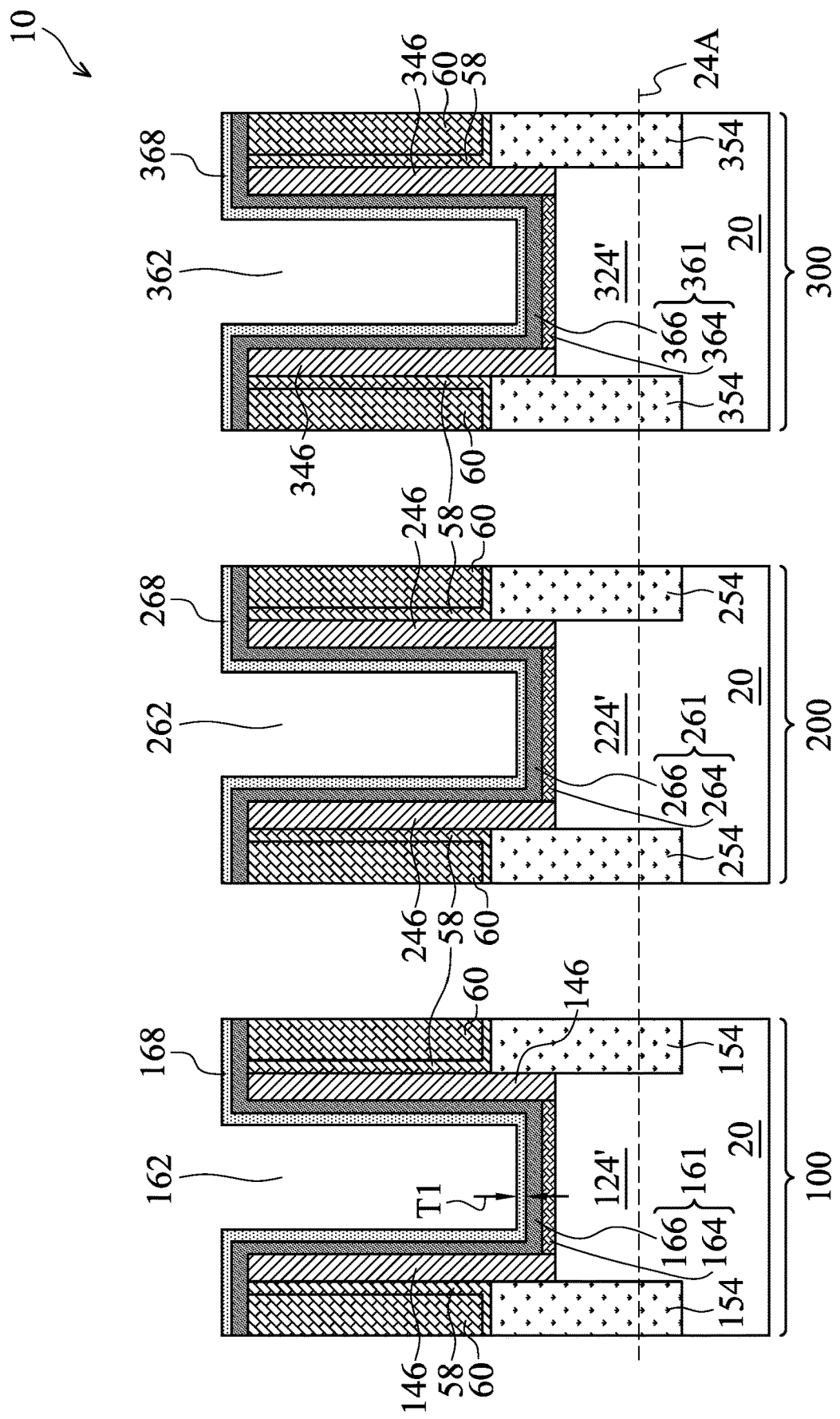

Next, referring to FIG. 9, gate dielectrics 161, 261, and 361 are formed, which extend into trenches 162, 262, and 362, respectively. The respective process is illustrated as process 418 in the process flow 400 shown in FIG. 22. In accordance with some embodiments of the present disclosure, the gate dielectrics include Interfacial Layers (ILs) 164, 264, and 364, which are formed on the exposed surfaces of protruding fins 124', 224', and 324', respectively. Each of ILs 164, 264, and 364 may include an oxide layer such as a silicon oxide layer, which may be formed through the thermal oxidation of protruding fins 124', 224', and 324', a chemical oxidation process, or a deposition process. The gate dielectrics may also include high-k dielectric layers 166, 266, and 366 over the corresponding ILs 164, 264, and 364. Each of high-k dielectric layers 166, 266, and 366 may be formed of lanthanum oxide, hafnium oxide, aluminum oxide, zirconium oxide, or the like. The dielectric constant (k-value) of the high-k dielectric material is higher than 3.9, and may be higher than about 7.0. High-k dielectric layers 166, 266, and 366 are overlying, and may contact, the respective underlying ILs 164, 264, and 364. High-k dielectric layers 166, 266, and 366 are formed as conformal layers, and extend on the sidewalls of protruding fins 124', 224', and 324' and the top surface and the sidewalls of gate spacers 146, 246, and 346, respectively. In accordance with some embodiments of the present disclosure, high-k dielectric layers 166, 266, and 366 are formed using ALD or CVD. High-k dielectric layers 166, 266, and 366 may be portions of the same dielectric layer, and are formed simultaneously using the same material and having the same thickness, or separately with different materials and/or different thicknesses.

FIG. 9 further illustrates the formation of first metal-containing layers 168, 268, and 368, which may be formed in a common deposition process (and may be portions of a same blanket layer) or separate deposition processes. The respective process is illustrated as process 420 in the process flow 400 shown in FIG. 22. The portions of the blanket layer extending into p-type FinFET regions may be used as the work-function layers of the p-type FinFETs. In accordance with some embodiments, metal-containing layers 168, 268, and 368 comprise titanium nitride, tantalum nitride, or the like. Metal-containing layers 168, 268, and 368 may be formed using a conformal deposition method such as Atomic Layer Deposition (ALD), Chemical Vapor Deposition (CVD), or the like. The thickness T1 of metal-containing layers 168, 268, and 368 may be in the range between about 5 Å and about 50 Å.

Figure 10:
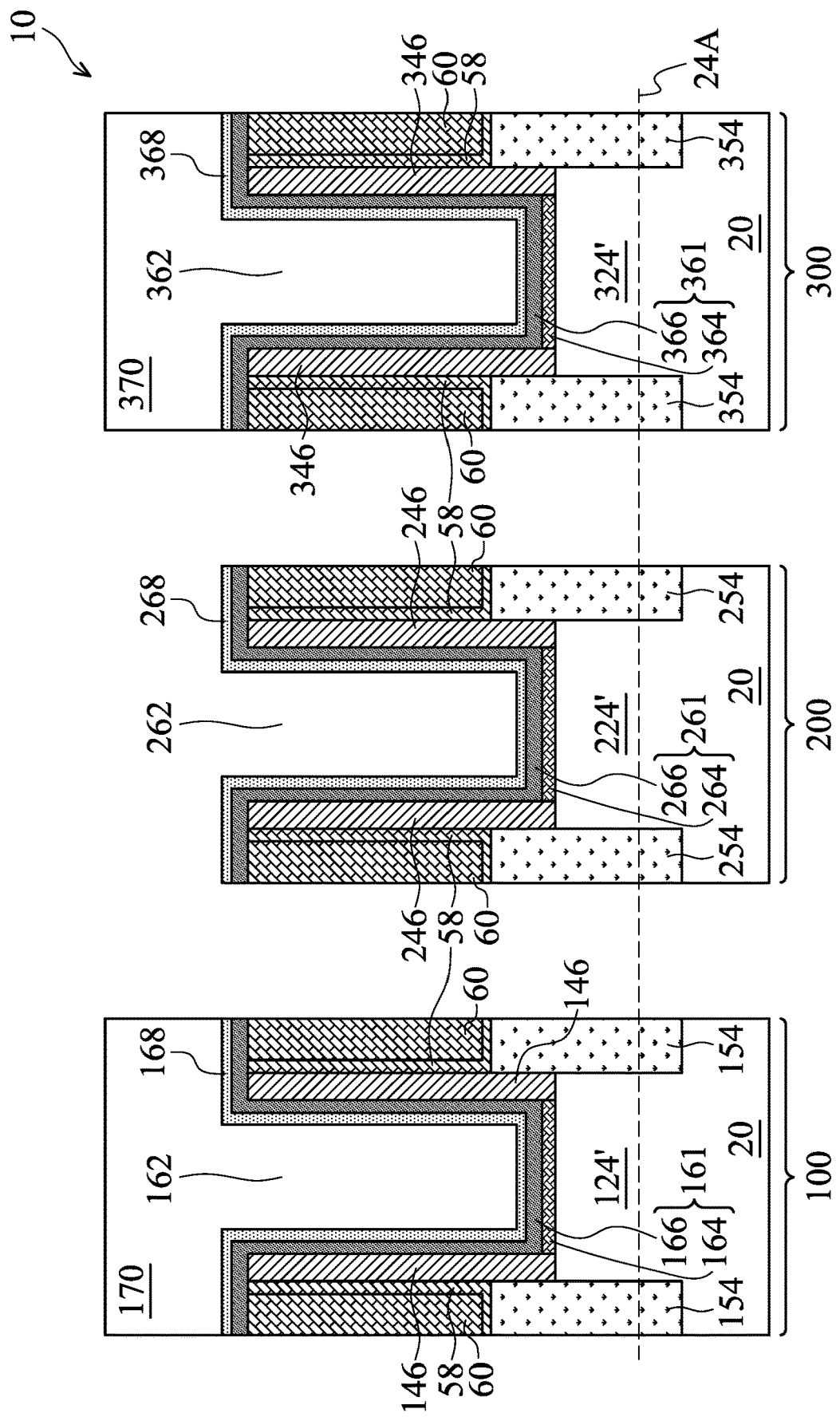

FIG. 10 illustrates the formation of a first etching mask, which includes etching masks (portions) 170 and 370 in device regions 100 and 300, respectively. The respective process is illustrated as process 422 in the process flow 400 shown in FIG. 22. In accordance with some embodiments, etching masks 170 and 370 include Bottom Anti-Reflective Coatings (BARCs) and photo resist layers over the BARCs. Hard mask (not shown) may be, or may not be, formed underlying the BARCs. In accordance with some embodiments, the hard masks may include a metal oxide layer such as an aluminum oxide layer, and a metal nitride layer such as a titanium nitride layer over the metal oxide layer. Metal-containing layer 268 is exposed through the etching masks.

Figure 11:
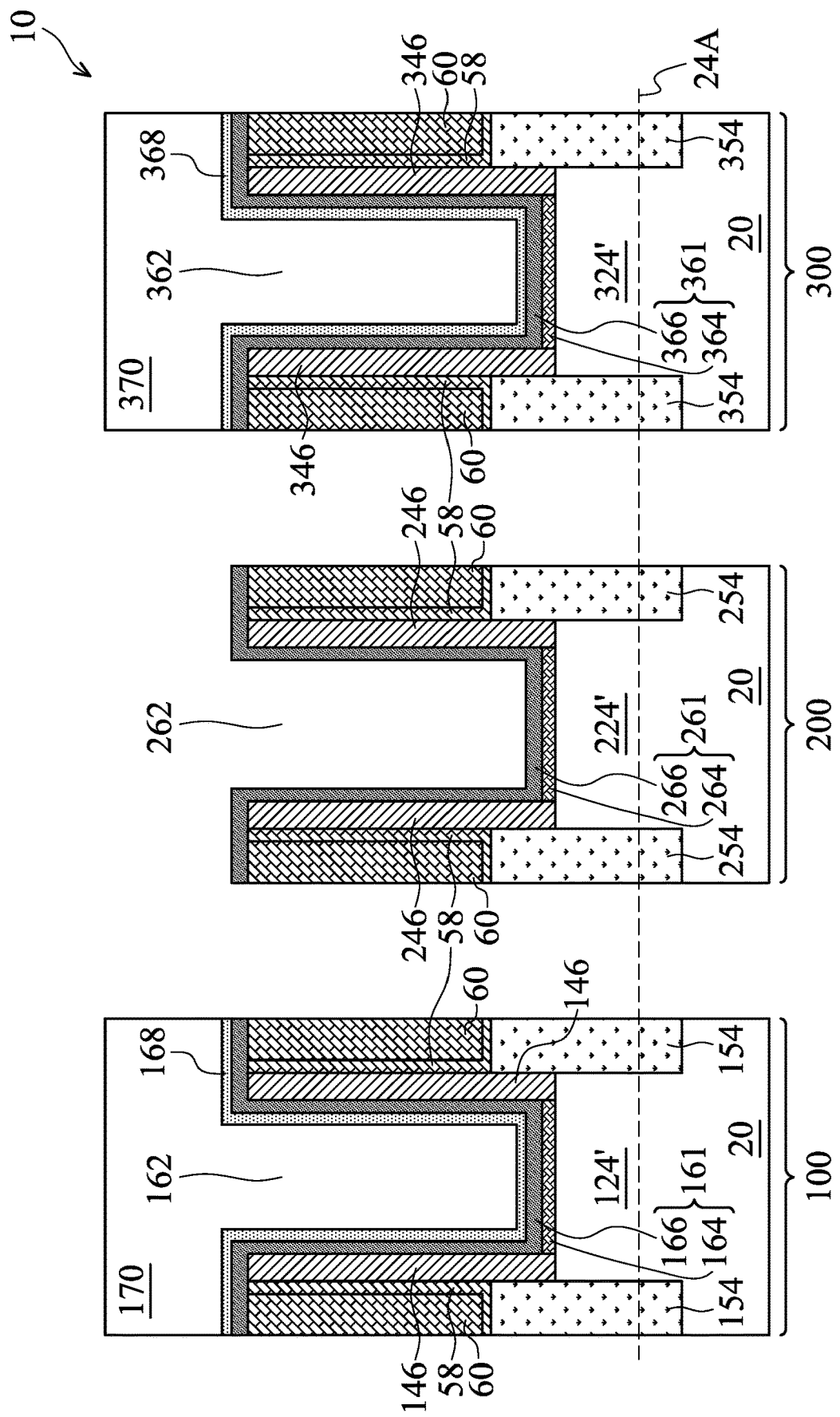

The exposed metal-containing layer 268 is removed in an etching process, and high-k dielectric layer 266 is exposed after the etching process. The respective process is illustrated as process 424 in the process flow 400 shown in FIG. 22. The resulting structure is shown in FIG. 11. In accordance with some embodiments of the present disclosure, the etching of metal-containing layer 268 is performed through a wet etching process, while a dry etching process may also be used.

Figure 12:
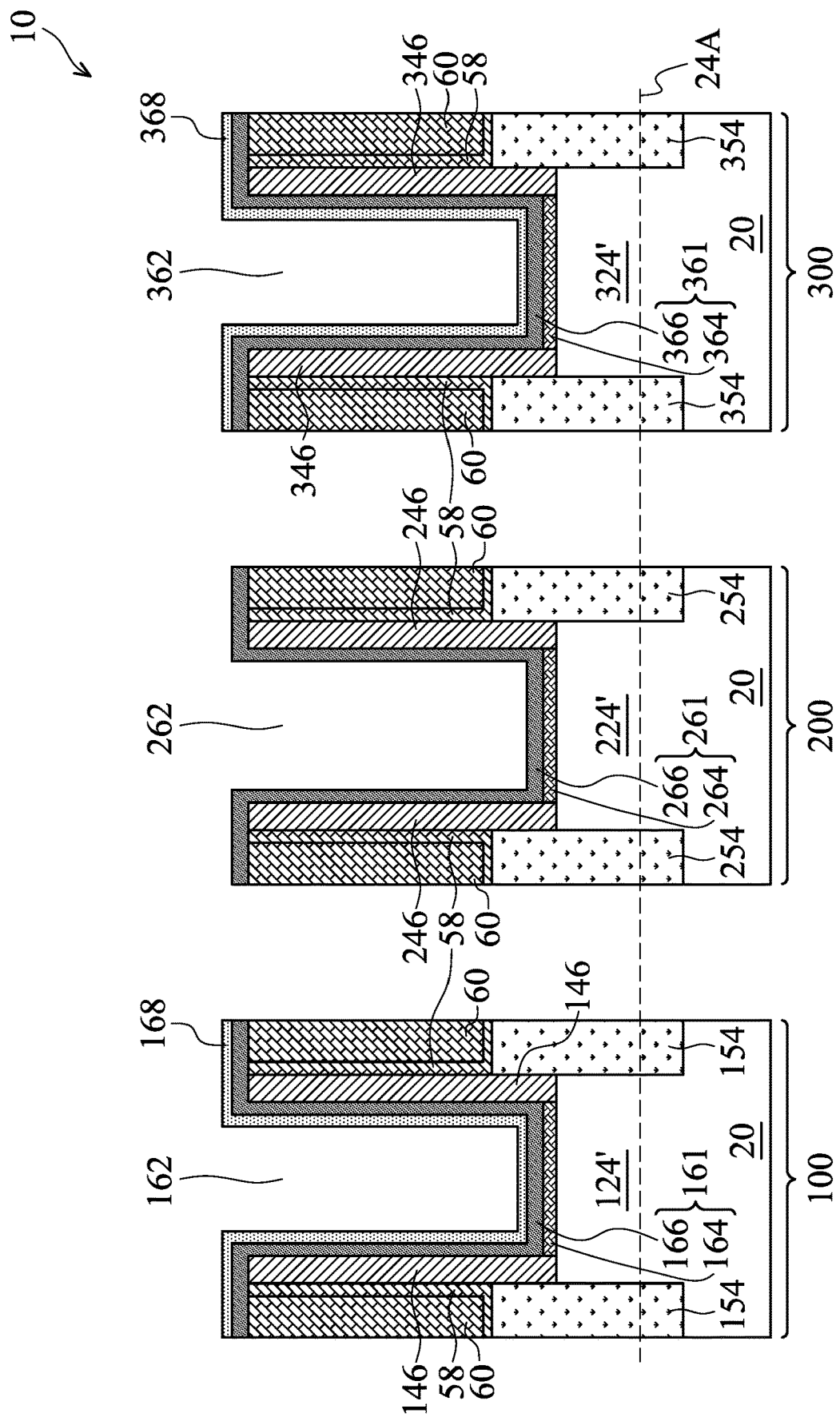

Next, etching masks 170 and 370 are removed. The resulting structure is shown in FIG. 12. In accordance with some embodiments, the photo resist may be removed through ashing, or removed using an etching gas comprising hydrogen ($H_2$) and nitrogen ($N_2$). The hard masks (if any) may be removed by using an etching chemical, which may include ammonium hydroxide, hydrogen peroxide hydrochloric acid, carbonic acid, and/or the like.

Figure 13:
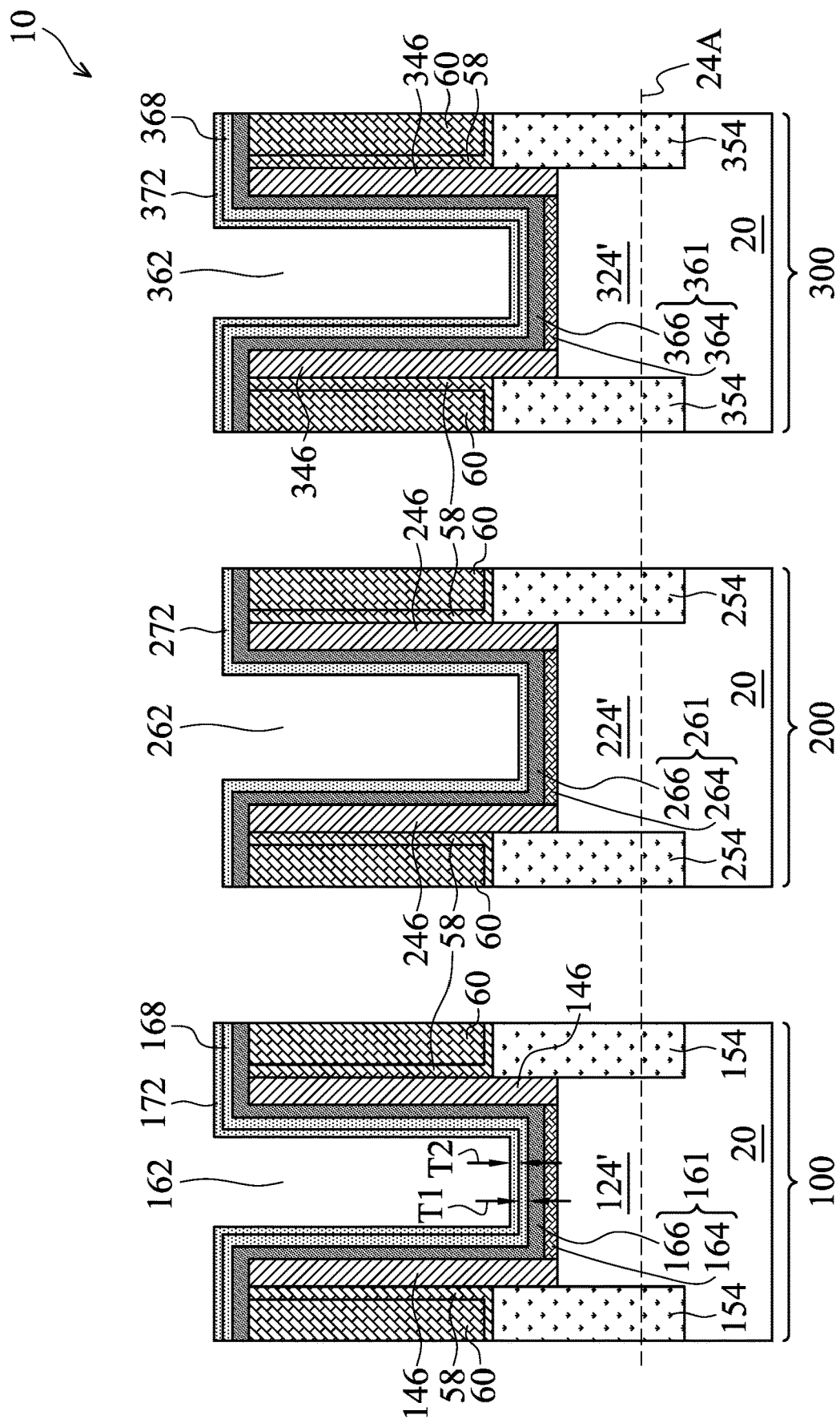
Figure 14:
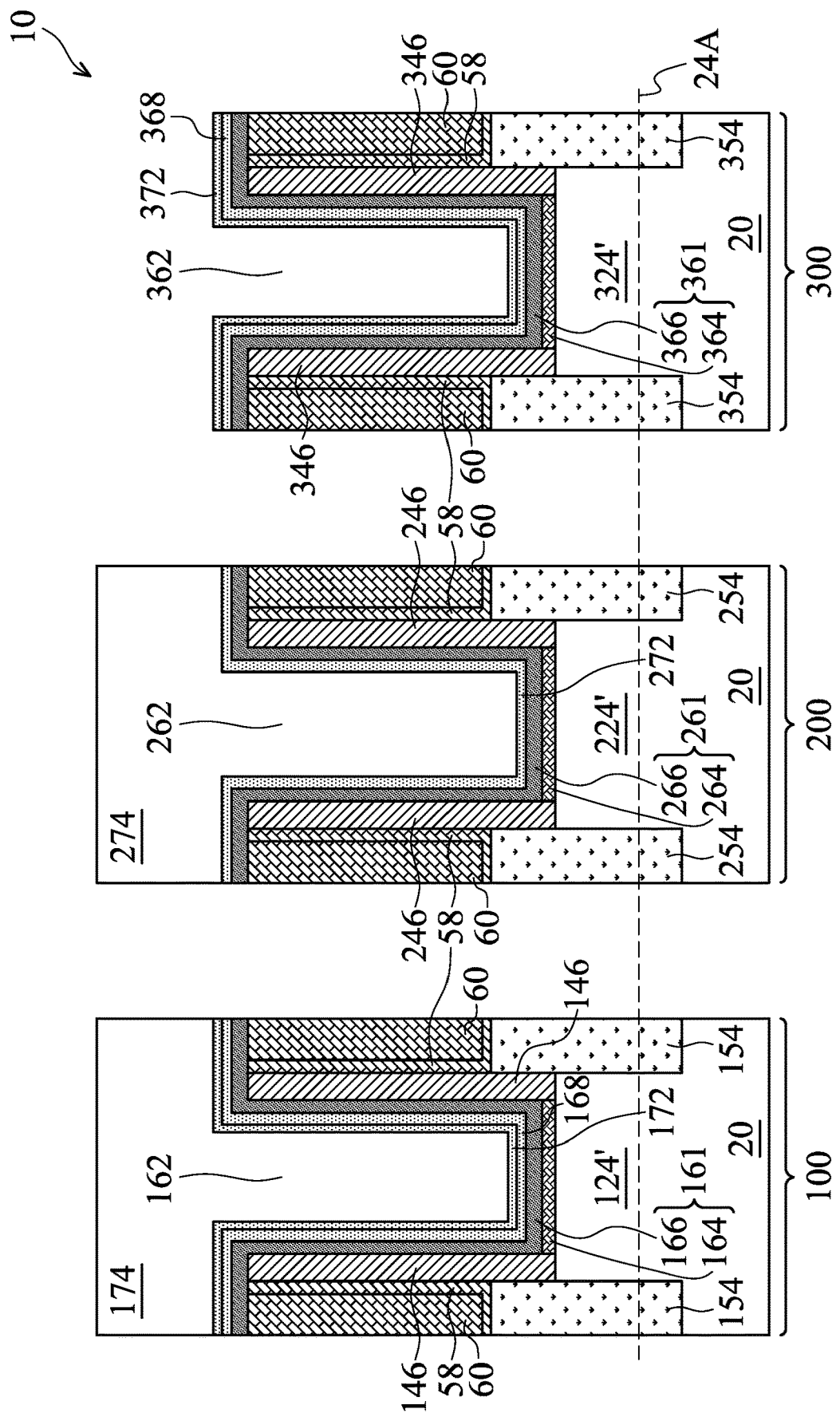
Figure 15:
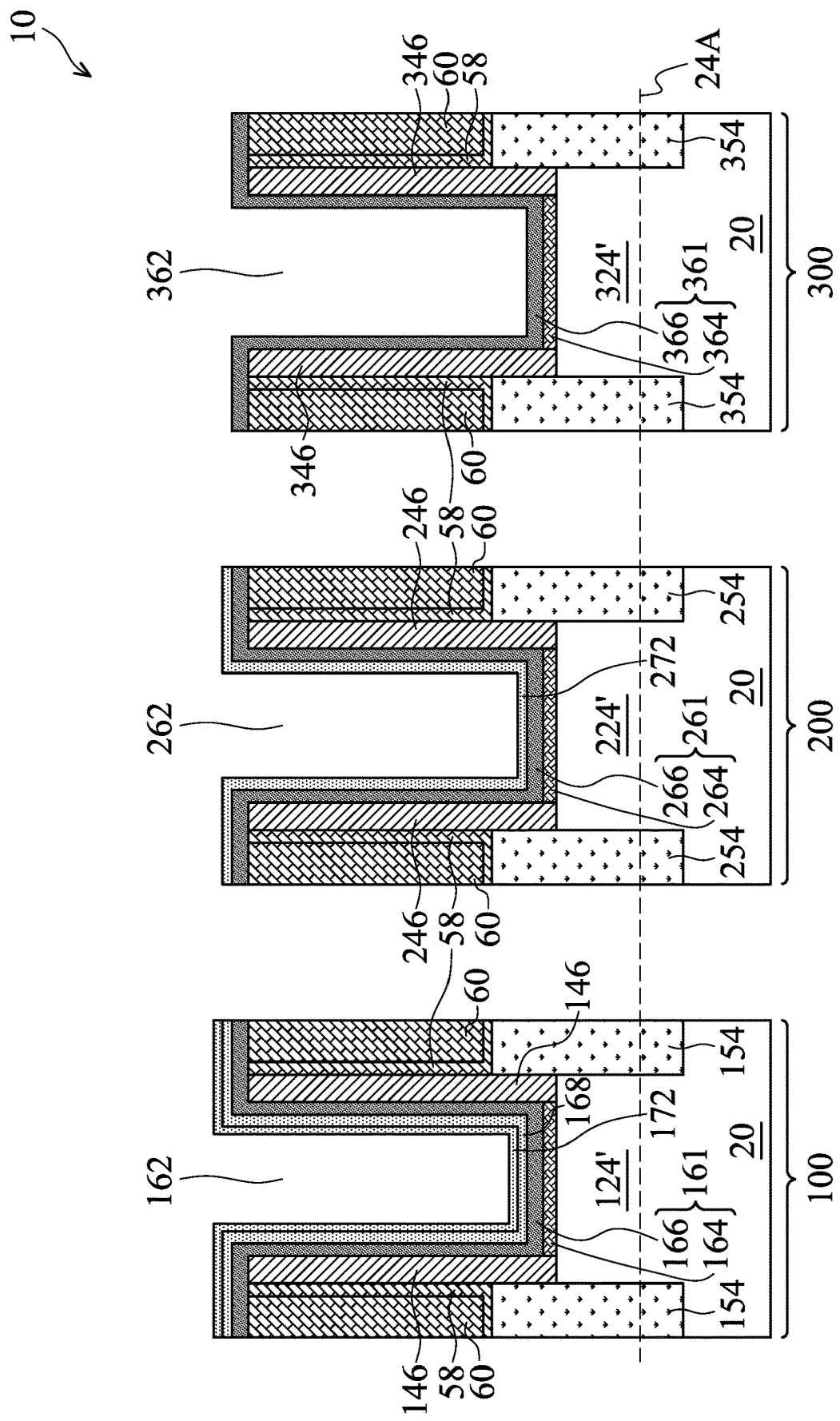

FIGS. 13 through 15 illustrate the formation of second metal-containing layers 172 and 272 in transistors regions 100 and 200, respectively. Referring to FIG. 13, metal-containing layers 172, 272, and 372 are formed, for example, in a common deposition process. The respective process is illustrated as process 426 in the process flow 400 shown in FIG. 22. The material of metal-containing layers 172, 272, and 372 may be similar to that of metal-containing layer 168. The thickness T2 of metal-containing layers 172, 272, and 372 may be similar to that of metal-containing layer 168. Depending on the intended magnitude of the tuning of threshold voltages of the transistors in device regions 100 and 200, thickness T2 may be greater than, equal to, or smaller than, thickness T1 of metal-containing layer 168. For example, thickness ratio T1/T2 may be in the range between about 0.5 and 2.0 in accordance with some embodiments of the present disclosure.

FIG. 14 illustrates the formation of a second etching mask including etching masks 174 and 274 in device regions 100 and 200, respectively, which are formed in a common deposition process, followed by a common lithography process. The respective process is illustrated as process 428 in the process flow 400 shown in FIG. 22. The material, the structure, and the formation method of etching masks 174 and 274 may be selected from the same group of candidate materials, structures, and formation methods of etching masks 170 and 370 (FIG. 10). In subsequent processes, metal-containing layers 372 and 368 are removed through an etching process. The respective process is illustrated as process 430 in the process flow 400 shown in FIG. 22. During the etching process, etching masks 174 and 274 are used to protect the metal-containing layers 168 and 172 in device region 100 and metal-containing layer 272 in device region 200. Etching masks 174 and 274 are then removed, and the resulting structure is shown in FIG. 15. The etching process of metal-containing layers 372 and 368 may be similar to the etching process of metal-containing layer 268 (FIGS. 10 and 11), and the details are not repeated.

As shown in the preceding patterning processes, metal-containing layer 368 is etched in the same process as the etching of metal-containing layer 372 (FIG. 15), rather than in the same process for etching metal-containing layer 268 (FIG. 11). This has the advantageous feature of exposing high-k dielectric layer 366 once, rather than twice, to the etching chemicals. This will reduce the loss in high-k dielectric layer 366 caused by the over-etching of the metal-containing layers. High-k dielectric layer 366 is thus exposed, as shown in FIG. 15.

Figure 16:
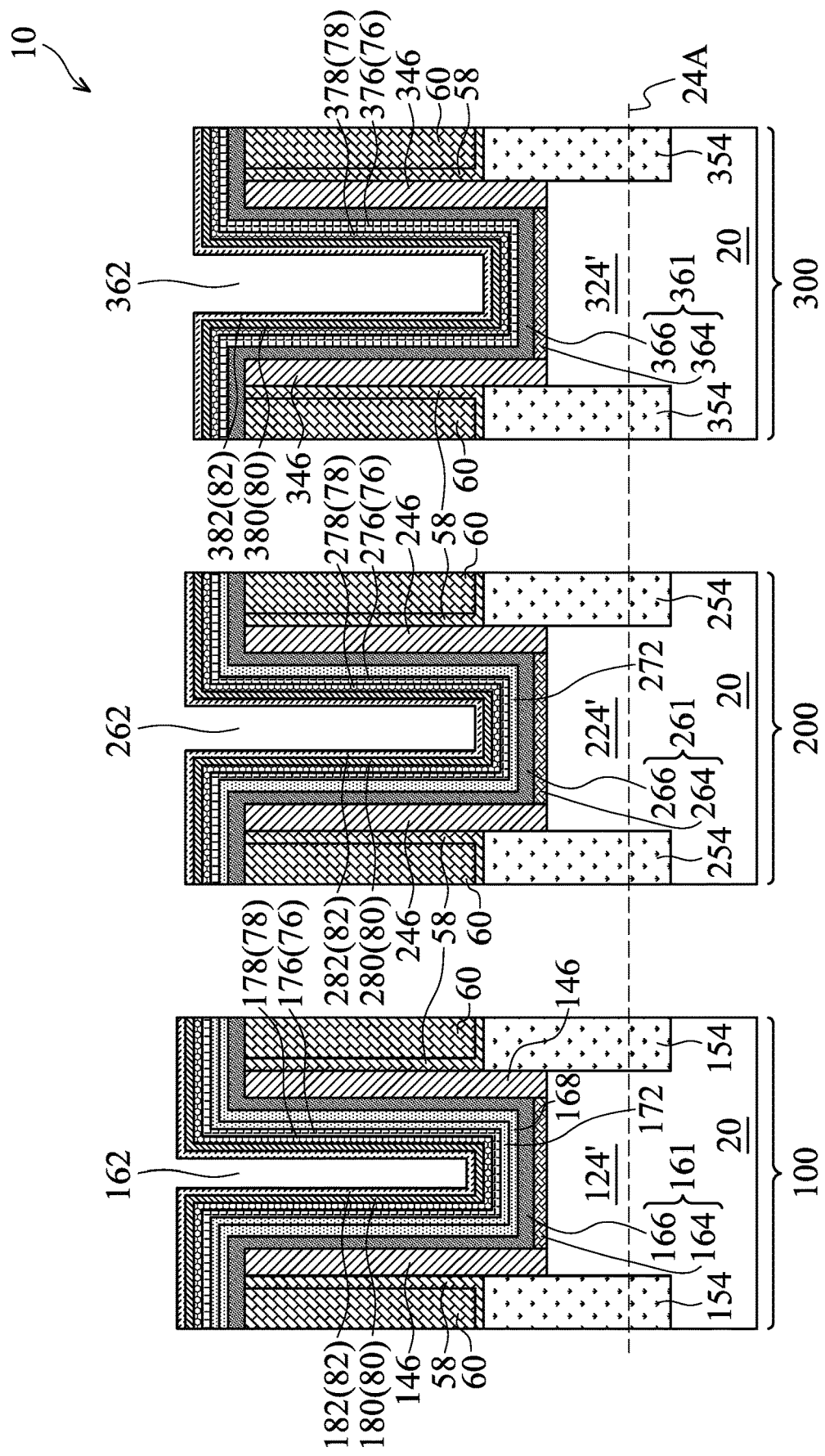

Next, a plurality of layers are deposited to fill trenches 162, 262, and 362, and the resulting structure is shown in FIG. 16. The stacked layers include work-function layer 76, capping layer 78, silicon capping layer 80, and glue layer 82. The respective process is illustrated as process 432 in the process flow 400 shown in FIG. 22. The stacked layers 76, 78, 80, and 82 are in-situ deposited in a same production tool without vacuum break therebetween. Alternatively stated, during an entire period starting at a first time the deposition of work-function layer 76 is started and ending at a second time the deposition of glue layer 82 is finished, wafer 10 is in a vacuum environment without vacuum break. Furthermore, during the entire period between the first time and the second time, wafer 10 is not exposed to oxygen-containing gases such as $O_2$, $O_3$, or the like, and is not exposed to water steam. The formation of the stacked layers, on the other hand, may be ex-situ to the formation of metal-containing layers 172 and 272, with vacuum breaking in between. Each of work-function layer 76, capping layer 78, silicon capping layer 80, and glue layer 82 includes portions in device regions 100, 200, and 300. Work-function layer 76 includes portions 176, 276, and 376. Capping layer 78 includes portions 178, 278, and 378. Silicon capping layer 80 includes portions 180, 280, and 380. Glue layer 82 includes portions 182, 282, and 382.

In accordance with some embodiments, work-function layer 76, which includes portions 176, 276, and 376 in device regions 100, 200, and 300, respectively, is formed using ALD, CVD, or the like. The materials may include an aluminum-based layer, which may be formed of or comprise TiAl, TiAlN, TiAlC, TaAlN, TaAlC, or the like, which are n-type work-function materials. The thickness of work-function layer 76 may be in the range between about 15 Å and about 50 Å in accordance with some embodiments.

In accordance with some embodiments, capping layer 78, which includes portions 178, 278, and 378 in device regions 100, 200, and 300, respectively, is deposited over work-function layer 76. Capping layer 78 may be formed of or comprises TiN, TaN, or the like, which may be deposited using a method such as ALD, CVD, or the like. The thickness of capping layer 78 may be smaller than about 10 Å.

Next, silicon capping layer 80, which includes portions 180, 280, and 380 in device regions 100, 200, and 300, respectively, is deposited over capping layer 78. In accordance with some embodiments, the deposition of silicon capping layer is performed by conducting a process gas(es) including a silicon-based precursor such as silane ($SiH_4$), disilane ($Si_2H_6$), or combinations thereof into the respective production tool. Other gases such as Ar, He, $N_2$, or the like may be added into the process gases. The formation process includes thermal soaking, wherein the temperature of the thermal soaking process may be in the range between about 300° C. and about 500° C. The duration of the thermal soaking process may be in the range between about 0.5 minutes and about 3 minutes. During the thermal soaking process, the partial pressure of the silicon-based precursor may be in the range between about 10 torr and about 35 torr. The thickness of the resulting silicon capping layer 80 may be smaller than about 12 Å, and may be in the range between about 5 Å and about 12 Å. Silicon capping layer 80, as deposited, may include elemental silicon atoms without forming compound with other elements, and the atomic percentage of silicon atoms in silicon capping layer 80 may be greater than about 90 percent, or between about 95 percent and 100 percent as deposited.

Next, after the formation of silicon capping layer 82, and without vacuum break, glue layer 82 is formed. In accordance with some embodiments, glue layer 82 comprises TiN, TaN, or the like. The formation process may include ALD, CVD, or the like. The thickness of glue layer 82 may be smaller than 25 Å, and may be smaller than about 20 Å. The thickness of glue layer 82 may be in the range between about 8 Å and about 20 Å in accordance with some embodiments. The process for forming glue layer 82 is free from oxygen-containing process gases.

Figure 17:
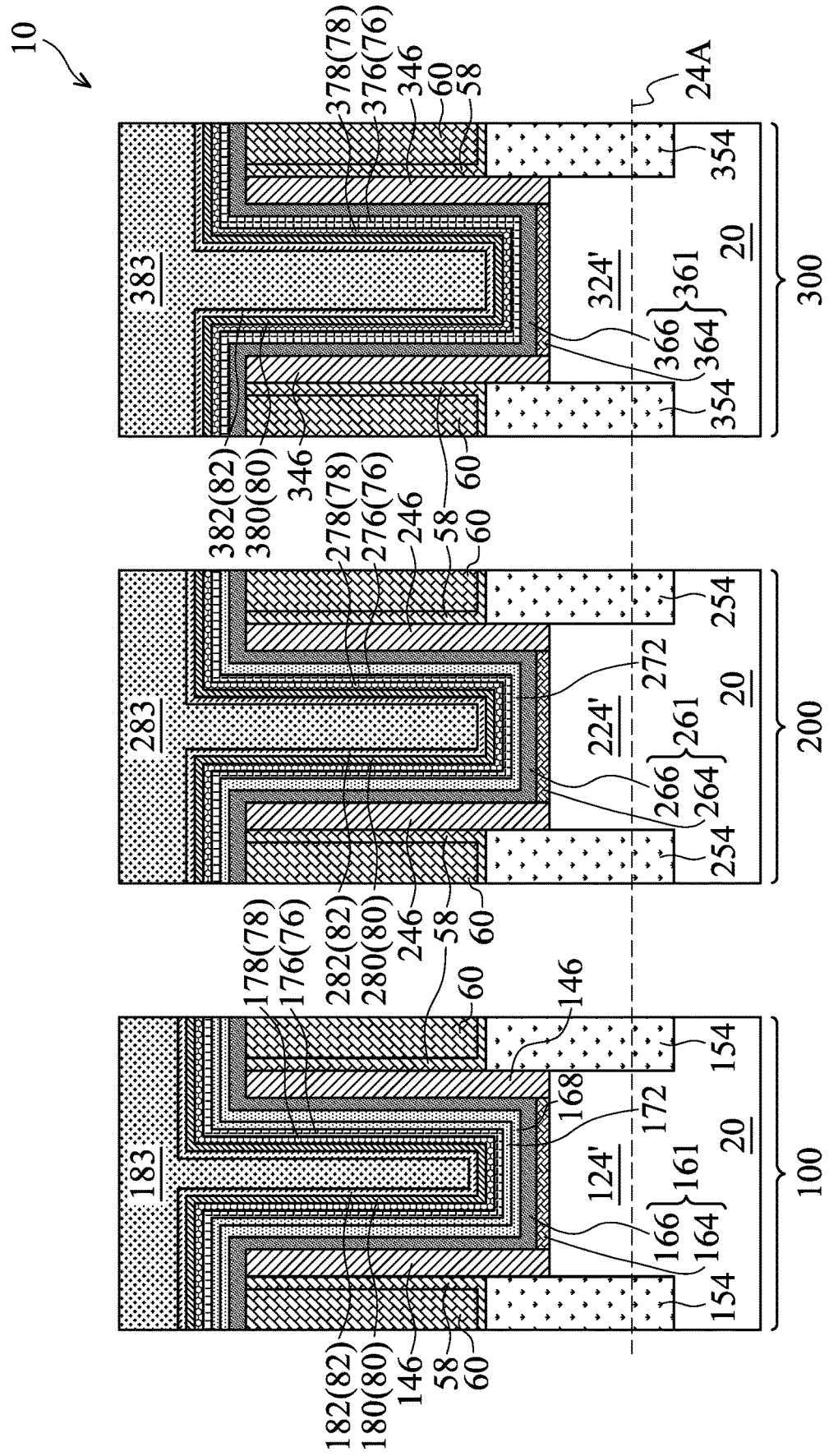

FIG. 17 illustrates the deposition of filling-metal regions 183, 283, and 383. The respective process is illustrated as process 434 in the process flow 400 shown in FIG. 22. Between the formation of glue layer 82 and the formation of filling-metal regions 183, 283, and 383, vacuum break may or may not occur. In accordance with some embodiments, filling-metal regions 183, 283, and 383 are formed of tungsten, cobalt, or the like, which may be deposited using ALD, CVD, or the like. In accordance with some embodiments, filling-metal regions 183, 283, and 383 are formed of or comprise tungsten (W). The precursor for forming filling-metal regions 183, 283, and 383 may include $WF_6$ and a reducing agent such as $H_2$. In accordance with some embodiments in which filling-metal regions 183, 283, and 383 are formed using ALD, the ALD process may include a plurality of ALD cycles, each including conducting $WF_6$, purging $WF_6$, conducting $H_2$, and purging $H_2$. The deposition process may be a thermal process performed at an elevated temperature, such as in the range between about 250° C. and about 400° C. In accordance with alternative embodiments, the deposition of filling-metal regions 183, 283, and 383 is achieved through CVD, for example, using $WF_6$ and $H_2$ as process gases. In accordance with some embodiments, filling-metal regions 183, 283, and 383 all extend into the unfilled portions of the respective trenches 162, 262, and 362 (FIG. 16), respectively. In accordance with alternative embodiments, either trench 162, or both of trenches 162 and 262, is fully filled after the formation of capping layer 82, and hence either filling-metal region 183, or both of filling-metal regions 183 and 283, are fully outside of the corresponding trenches 162 and 262.

Figure 18:
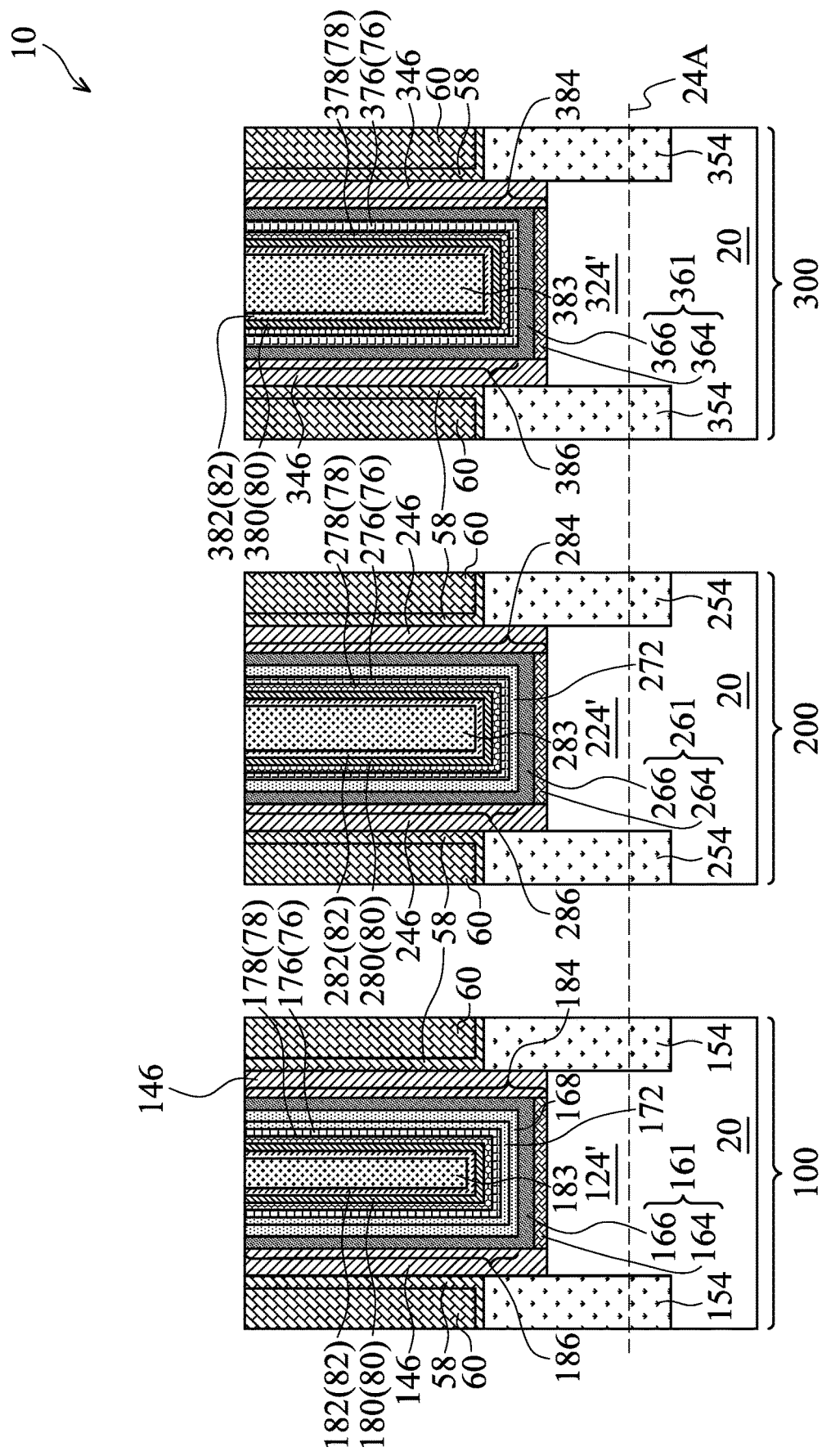

After the trenches are fully filled, a planarization process is performed to remove excess portions of the plurality of layers, resulting in the gate stacks 184, 284, and 384 as shown in FIG. 18. The respective process is illustrated as process 436 in the process flow 400 shown in FIG. 22. Gate stacks 184, 284, and 384 include gate electrodes 186, 286, and 386, respectively.

Figure 19A:
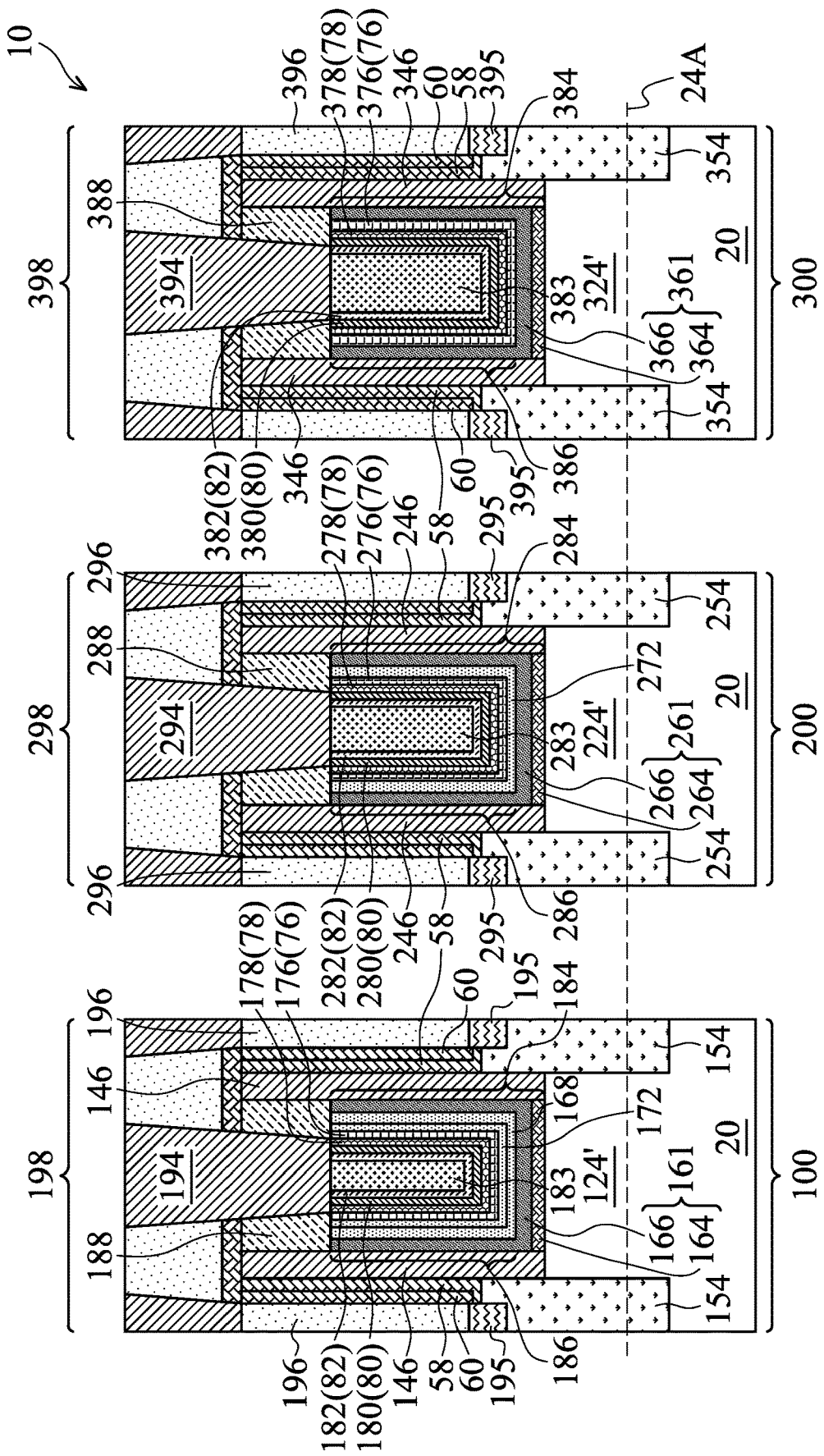

FIG. 19A illustrates the formation of self-aligned hard masks 188, 288, and 388 in accordance with some embodiments, which may include performing an etching process to recess gate stacks 184, 284, and 384, so that recesses are formed. The recesses are then filled with a dielectric material, followed by a planarization process to remove excess portions of the dielectric material, with the remaining dielectric material forming hard masks 188, 288, and 388. Hard masks 188, 288, and 388 may be formed of silicon nitride, silicon oxynitride, silicon oxy-carbo-nitride, or the like.

Further referring to FIG. 19A, silicide regions 195, 295, and 395 and source/drain contact plugs 196, 296, and 396 are formed to electrically connect to source/drain regions 154, 254, and 354, respectively. Gate contact plugs 194, 294, and 394 are formed to electrically connect to gate electrodes 186, 286, and 386, respectively. FinFETs 198, 298, and 398 are thus formed in device regions 100, 200, and 300, respectively.

Figure 19B:
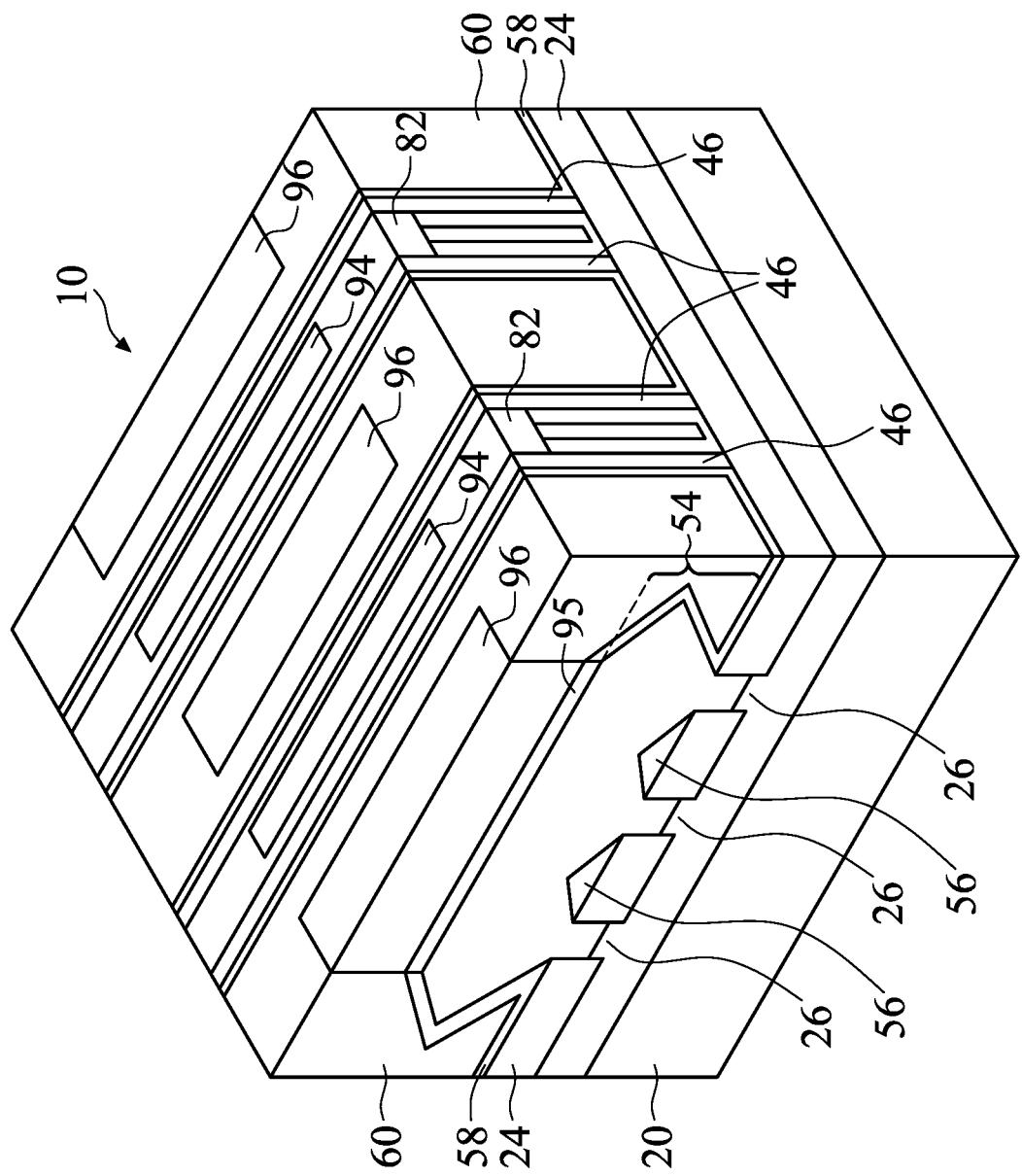

FIG. 19B illustrates a perspective view of a FinFET 98, which may represent FinFETs 198, 298, and 398 as shown in FIG. 20A. Gate contact plug 94 (representing 194, 294, and 394 in FIG. 20A), source/drain silicide regions 95 (representing 195, 295, and 395 in FIG. 19A), and source/drain contact plugs 96 (representing 196, 296, and 396 in FIG. 20A) are also illustrated.

Transistors 198, 298, and 398 have different threshold voltages due to the tuning effect caused by the layers underlying the corresponding work-function layers. For example, when transistors 198, 298, and 398 are n-type transistors, transistor 198 has layers 168 and 172 underneath the respective work-function layer 176, transistor 298 has layers 272 underneath the respective work-function layer 276, and transistor 398 does not have any layer between work-function layer 376 and high-k dielectric layer 366. Accordingly, the threshold voltages of transistors 198, 298, and 398 are different from each other. When transistors 198, 298, and 398 are n-type transistors, the threshold voltage of transistor 198 is the lowest among three, and the threshold voltage of transistor 398 is the highest among three.

As shown in FIG. 16, work-function layer 76, capping layer 78, silicon capping layer 80, and glue layer 82 are in-situ formed without any vacuum break between these processes. Accordingly, capping layer 78 and silicon capping layer 80 may efficiently protect work-function layer 76 from being exposed to oxygen, water, etc. in the open air, and work-function layer 76 is not adversely oxidized. Furthermore, since glue layer 82 is deposited on silicon capping layer 80 before any vacuum break occurs, silicon capping layer 80 is not oxidized. If vacuum break occurs, and silicon capping layer 80 is oxidized, the gate resistance will increase, causing the performance of the resulting transistor to degrade. It is noted, that the oxide of the silicon capping layer will not fully electrically insulate its overlying portion from the underlying portion. Rather, the gate resistance Rg will be increased. In the embodiments of the present disclosure, by preventing silicon capping layer 80 from being oxidized, the gate resistance Rg may be reduced by up to about 22 percent.

In addition, if silicon capping layer 80 is oxidized, the glue layer 82 has to be formed thicker in order to effectively perform the function of gluing the overlying filling-metal regions 183, 283, and 383 to the respective underlying silicon capping layer 180, 280, and 380. For example, the thickness of glue layer 82 needs to be greater than about 25 Å. Otherwise, peeling may occur between silicon capping layers 180, 280, and 380 and the corresponding overlying filling-metal regions 183, 283, and 383. In the embodiments of the present disclosure, however, since silicon capping layer 82 is not oxidized, the thickness of the glue layer 82 may be significantly reduced, for example, to the range between about 8 Å and about 20 Å without sacrificing its gluing function.

Figure 20:
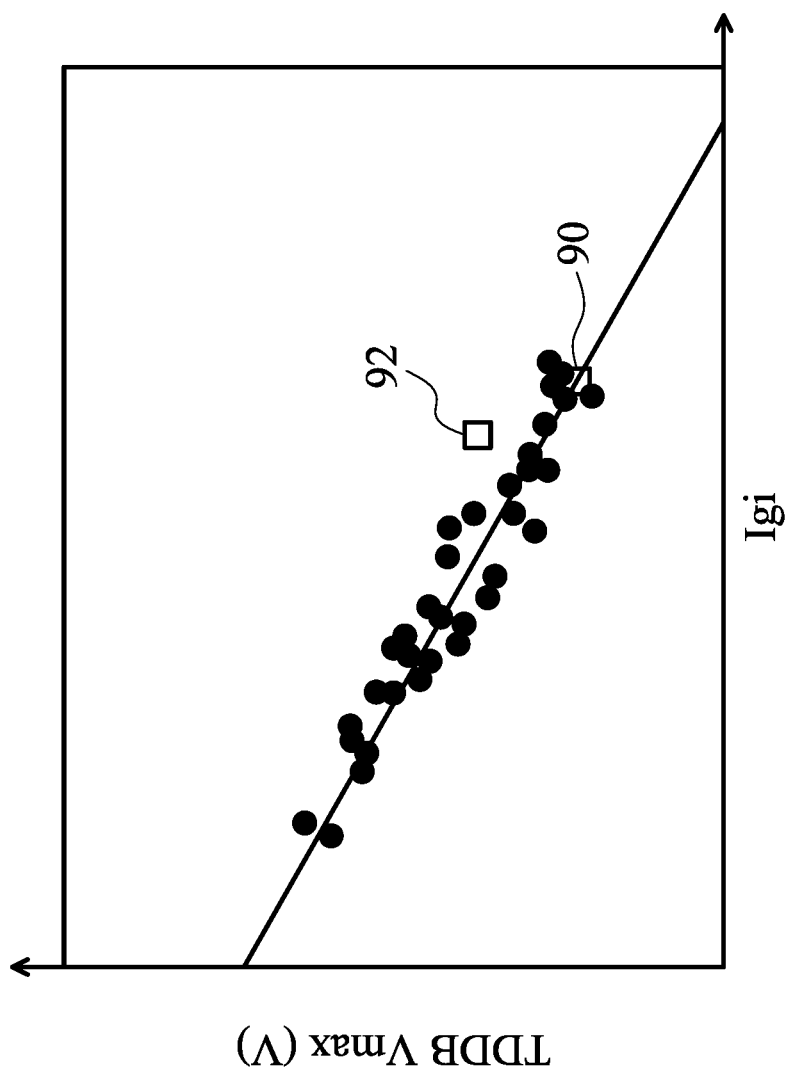
FIG. 20 illustrates the Time-Dependent Dielectric Breakdown (TDDB) data of a gate stack formed in accordance with some embodiments.

An additional advantageous feature of reducing the thickness of glue layer 82 is that by reducing the thickness of glue layer 82, the distance between filling-metal regions 183, 283, and 383 and the respective underlying high-k dielectric layers 166, 266, and 366 is reduced. Accordingly, more fluorine in the filling-metal regions 183, 283, and 383 may diffuse into the high-k dielectric layers. Experiment results indicate that by adopting the embodiments of the present disclosure, the amount of fluorine diffused into the high-k gate dielectrics 166, 266, and 366 may be increased by about 15.9 percent in a sample wafer. This may significantly improve the device reliability. For example, FIG. 20 illustrates the Time-Dependent Dielectric Breakdown (TDDB) Vmax (Y-axis) of the high-k gate dielectrics as a function of current Igi (the leakage current flowing through the high-k gate dielectrics, X-axis). The corresponding experiments were performed at 125° C. The results indicated that when the thickness of glue layer is 20 Å (point 90), the TDDB Vmax is 0.99 volts. When the embodiments of the present disclosure are adopted, and the thickness of the glue layer is reduced to 12 Å, the TDDB Vmax is increased by about 80 mV, indicating the reliability of the high-k gate dielectrics is increased.

Figure 21:
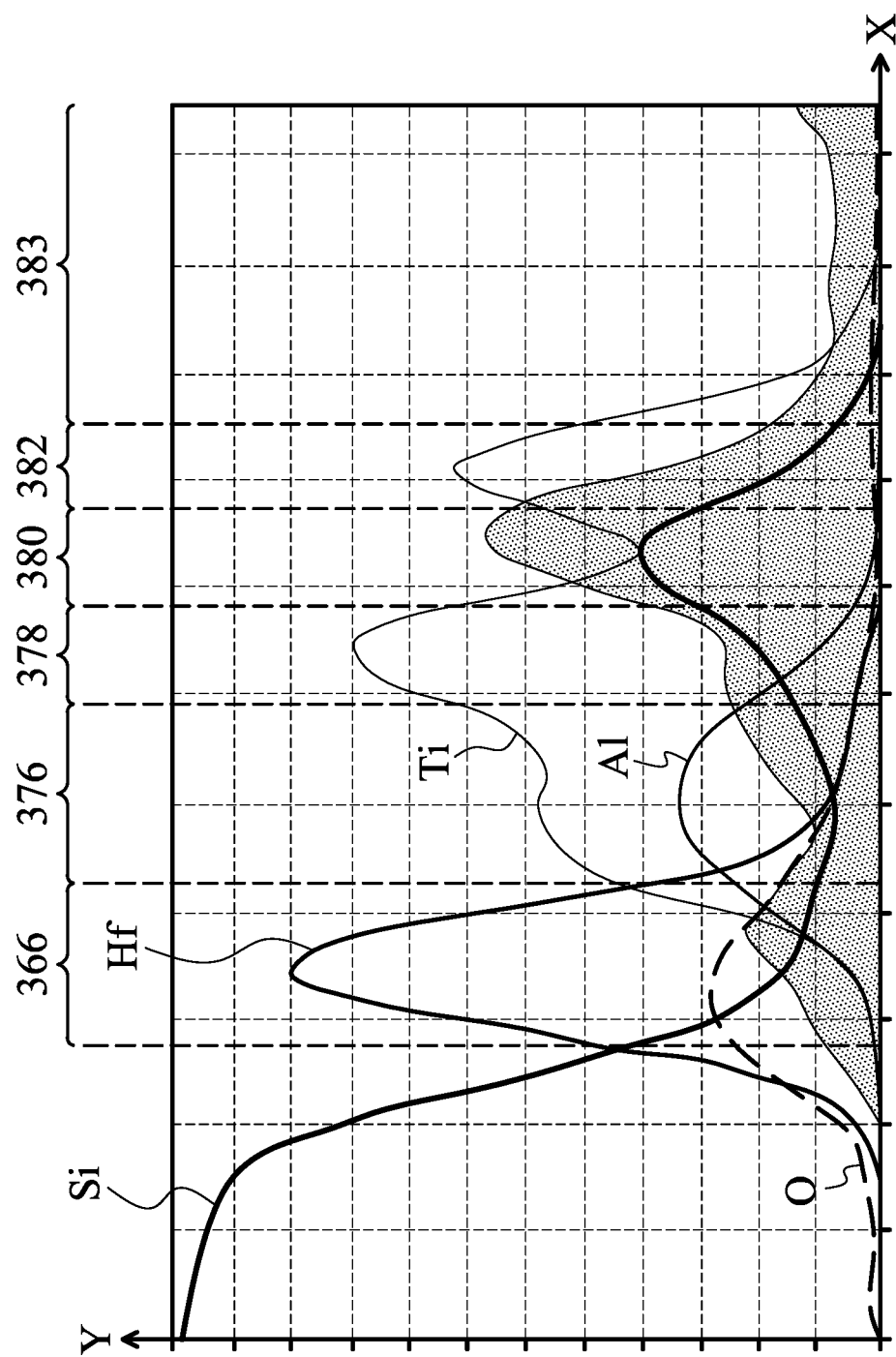
FIG. 21 illustrates an example distribution profile of some elements in a gate stack in accordance with some embodiments.

FIG. 21 illustrates example distribution profile of some elements in gate electrode 386 (FIG. 19A) in accordance with some embodiments. The X-axis shows the positions in gate stack, and the Y-axis shows the signal intensity of elements. The distribution of elements Hf, O, Si, Al, and Ti in high-k dielectric layer 366, work-function layer 376, (TiN) capping layer 378, silicon layer 380, (TiN) glue layer 382 and filling-metal region 383 is shown. The results indicate that no oxygen is at the interface between silicon layer 380 and (TiN) glue layer 382 due to the in-situ deposition of these layers.

The embodiments of the present disclosure have some advantageous features. By in-situ forming a metal-containing capping layer over a work-function layer, and a silicon capping layer over the metal-containing layer, the work-function layer is protected from oxidation. On the other hand, the silicon capping layer is also prone to oxidation, and hence an in-situ deposition process is performed to form a glue layer on the silicon capping layer and to ensure the silicon capping layer is not oxidized. This in turn allows the glue layer to be formed thinner, and the TDDB-related reliability of the gate dielectric of the resulting transistor is improved.

In accordance with some embodiments of the present disclosure, a method comprises forming a first gate dielectric on a first semiconductor region; depositing a first work-function layer over the first gate dielectric; depositing a first silicon layer over the first work-function layer; depositing a first glue layer over the first silicon layer, wherein the first work-function layer, the first silicon layer, and the first glue layer are in-situ deposited; depositing a first filling-metal over the first glue layer; and performing a planarization process, wherein remaining portions of the first glue layer, the first silicon layer, and the first work-function layer form portions of a gate electrode. In an embodiment, the method further comprises depositing a metal-containing capping layer over the first work-function layer, wherein the first silicon layer is further over the metal-containing capping layer, and wherein the first work-function layer, the metal-containing capping layer, the first silicon layer, and the first glue layer are in-situ performed. In an embodiment, the first glue layer comprises titanium nitride, and the first glue layer is in physical contact with the first silicon layer. In an embodiment, the first silicon layer is formed by thermally soaking a wafer that comprises the first work-function layer in a silicon-based precursor. In an embodiment, the method further comprises forming a second gate dielectric on a second semiconductor region; depositing a metal-containing layer over the second gate dielectric; depositing a second work-function layer over the metal-containing layer, wherein the metal-containing layer and the second work-function layer are formed of different materials; depositing a second silicon layer over the second work-function layer; depositing a second glue layer over the second silicon layer, wherein the second work-function layer, the second silicon layer, and the second glue layer are in-situ performed; and depositing a second filling-metal over the second glue layer. In an embodiment, the metal-containing layer and the second work-function layer are ex-situ performed, with a vacuum break therebetween. In an embodiment, the first glue layer has a thickness smaller than 25 Å. In an embodiment, during an entirety of in-situ deposition processes for depositing the first work-function layer, the first silicon layer, and the first glue layer, no oxygen ($O_2$) is used.

In accordance with some embodiments of the present disclosure, an integrated circuit device comprises a semiconductor region; a gate dielectric over the semiconductor region; a work-function layer over the gate dielectric; a silicon layer over the work-function layer; a glue layer over and contacting the silicon layer; and a filling-metal region over and contacting the glue layer. In an embodiment, the glue layer has a thickness smaller than 25 Å. In an embodiment, the silicon layer comprises elemental silicon atoms, and the elemental silicon atoms are in physical contact with the glue layer. In an embodiment, the glue layer comprises titanium nitride. In an embodiment, the integrated circuit device further comprises a titanium nitride layer between the work-function layer and the silicon layer. In an embodiment, the work-function layer is an n-work-function layer. In an embodiment, the silicon layer has a thickness smaller than about 10 Å.

In accordance with some embodiments of the present disclosure, a device comprises a semiconductor fin; a high-k dielectric on the semiconductor fin; a work-function layer over the high-k dielectric; a first titanium nitride layer over the work-function layer; a silicon layer over the first titanium nitride layer; a second titanium nitride layer over the silicon layer, wherein an interface between the silicon layer and the second titanium nitride layer is free from oxygen; and a filling-metal region over and contacting the second titanium nitride layer. In an embodiment, the first titanium nitride layer is in physical contact with the work-function layer. In an embodiment, the second titanium nitride layer has a thickness smaller than 25 Å. In an embodiment, the second titanium nitride layer has a thickness in a range between about 8 Å and about 20 Å. In an embodiment, the silicon layer has a thickness smaller than about 10 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first gate dielectric on a first semiconductor region;
    depositing a first work-function layer over the first gate dielectric;
    depositing a first silicon layer over the first work-function layer, wherein at a time the first silicon layer is deposited, the first silicon layer comprises elemental silicon;
    depositing a first glue layer over the first silicon layer, wherein the first work-function layer, the first silicon layer, and the first glue layer are in-situ deposited, and wherein during an entirety of in-situ deposition processes for depositing the first work-function layer, the first silicon layer, and the first glue layer, no oxygen ($O_2$) is used;
    depositing a first filling-metal over the first glue layer; and
    performing a planarization process, wherein remaining portions of the first glue layer, the first silicon layer, and the first work-function layer form portions of a gate electrode.

2. The method of claim 1 further comprising depositing a metal-containing capping layer over the first work-function layer, wherein the first silicon layer is further over the metal-containing capping layer, and wherein the first work-function layer, the metal-containing capping layer, the first silicon layer, and the first glue layer are in-situ performed.

3. The method of claim 1, wherein the first silicon layer is formed by thermally soaking a wafer that comprises the first work-function layer in a silicon-based precursor.

4. The method of claim 1 further comprising:
    forming a second gate dielectric on a second semiconductor region;
    depositing a metal-containing layer over the second gate dielectric;
    depositing a second work-function layer over the metal-containing layer, wherein the metal-containing layer and the second work-function layer are formed of different materials;
    depositing a second silicon layer over the second work-function layer;
    depositing a second glue layer over the second silicon layer, wherein the second work-function layer, the second silicon layer, and the second glue layer are in-situ performed; and
    depositing a second filling-metal over the second glue layer.

5. The method of claim 4, wherein the metal-containing layer and the second work-function layer are ex-situ performed, with a vacuum break there between.

6. The method of claim 1, wherein the first glue layer has a thickness smaller than 25 Å.

7. An integrated circuit device comprising:
    a semiconductor region;
    a gate dielectric over the semiconductor region;
    a work-function layer over the gate dielectric;
    a silicon layer over the work-function layer, wherein the silicon layer is an electrically conductive layer;
    a glue layer over and contacting the silicon layer, and wherein an interface between the silicon layer and the glue layer is free from oxygen; and
    a filling-metal region over and contacting the glue layer.

8. The integrated circuit device of claim 7, wherein the glue layer has a thickness smaller than 25 Å.

9. The integrated circuit device of claim 7, wherein the silicon layer comprises elemental silicon atoms.

10. The integrated circuit device of claim 7, wherein the glue layer comprises titanium nitride.

11. The integrated circuit device of claim 7 further comprising a titanium nitride layer between the work-function layer and the silicon layer.

12. The integrated circuit device of claim 7, wherein the work-function layer is an n-work-function layer.

13. The integrated circuit device of claim 7, wherein the silicon layer has a thickness smaller than about 10 Å.

14. The integrated circuit device of claim 7, wherein the silicon layer is free from silicon oxide therein.

15. The integrated circuit device of claim 7, wherein the glue layer comprises titanium nitride.

16. A device comprising:
    a semiconductor fin;
    a high-k dielectric on the semiconductor fin;
    a work-function layer over the high-k dielectric;
    a first titanium nitride layer over the work-function layer;
    a silicon layer over the first titanium nitride layer;
    a second titanium nitride layer over the silicon layer, wherein an interface between the silicon layer and the second titanium nitride layer is free from oxygen, wherein the silicon layer is configured to electrically interconnect the first titanium nitride layer and the second titanium nitride layer; and a filling-metal region over and contacting the second titanium nitride layer.

17. The device of claim 16, wherein the first titanium nitride layer is in physical contact with the work-function layer.

18. The device of claim 16, wherein the silicon layer comprises elemental silicon.

19. The device of claim 16, wherein the silicon layer has a thickness smaller than about 10 Å.

20. The device of claim 16, wherein the silicon layer is free from silicon oxide therein.

* * * * *